United States Patent
Alskran et al.

(10) Patent No.: US 12,294,212 B2
(45) Date of Patent: *May 6, 2025

(54) SIMPLIFIED VOLTAGE-BOOSTING SNUBBER NETWORK

(71) Applicant: Advanced Energy Industries, Inc., Denver, CO (US)

(72) Inventors: Faleh Alskran, Timnath, CO (US); John Dorrenbacher, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/415,448

(22) Filed: Jan. 17, 2024

(65) Prior Publication Data

US 2024/0154404 A1 May 9, 2024

Related U.S. Application Data

(63) Continuation of application No. 17/412,813, filed on Aug. 26, 2021, now Pat. No. 11,888,311.

(51) Int. Cl.
*H02H 9/02* (2006.01)
*H02J 1/06* (2006.01)
*H01J 37/32* (2006.01)
*H02J 7/34* (2006.01)

(52) U.S. Cl.
CPC ............... *H02H 9/02* (2013.01); *H02J 1/06* (2013.01); *H01J 37/32009* (2013.01); *H02J 7/345* (2013.01)

(58) Field of Classification Search
CPC ....... H01J 37/32009; H02H 9/02; H02H 9/04; H02J 1/06; H02J 7/345
USPC ...................................................... 315/111.21
See application file for complete search history.

(56) References Cited

U.S. PATENT DOCUMENTS

| | | | | |
|---|---|---|---|---|
| 4,760,324 A | * | 7/1988 | Underhill | H02M 3/1563 363/63 |
| 4,772,810 A | * | 9/1988 | Felps | H02M 3/335 361/84 |
| 5,260,607 A | * | 11/1993 | Kinbara | H02M 1/34 327/427 |

(Continued)

OTHER PUBLICATIONS

Kellner, Alexandra, International Search Report and Written Opinion re: PCT/US2022/040544, International Searching Authority, dated Nov. 22, 2022, 14 pages.

(Continued)

*Primary Examiner* — William Hernandez
(74) *Attorney, Agent, or Firm* — NOD Law PC

(57) ABSTRACT

This disclosure describes a non-dissipative snubber circuit configured to boost a voltage applied to a load after the load's impedance rises rapidly. The voltage boost can thereby cause more rapid current ramping after a decrease in power delivery to the load which results from the load impedance rise. In particular, the snubber can comprise a combination of a capacitive element, two inductive elements, and three switches, where a duty cycle of two of the three switches controls the voltage boost. The snubber can be arranged between a DC power supply and a switching circuit configured to generate a pulsed waveform for provision to the load.

20 Claims, 25 Drawing Sheets

(56) References Cited

U.S. PATENT DOCUMENTS

| | | | | |
|---|---|---|---|---|
| 5,615,094 A * | 3/1997 | Cosentino | ............... | H02M 1/34 |
| | | | | 363/56.12 |
| 5,991,174 A * | 11/1999 | Farrington | ............ | H02M 3/158 |
| | | | | 323/225 |
| 6,060,867 A * | 5/2000 | Farrington | ............... | H02M 1/34 |
| | | | | 323/225 |
| 9,129,776 B2 * | 9/2015 | Finley | ...................... | H05H 1/46 |
| 9,287,098 B2 * | 3/2016 | Finley | ................. | C23C 14/3485 |
| 9,620,340 B2 * | 4/2017 | Finley | ...................... | H05H 1/46 |
| 2006/0262577 A1 * | 11/2006 | Schenk | .................. | H02M 1/34 |
| | | | | 363/50 |
| 2014/0117861 A1 * | 5/2014 | Finley | ............... | H01J 37/32064 |
| | | | | 315/172 |
| 2014/0117872 A1 * | 5/2014 | Finley | ................ | H01J 37/3405 |
| | | | | 323/229 |
| 2016/0181074 A1 | 6/2016 | Finley | | |

OTHER PUBLICATIONS

Tang et al, "Dual Switches DC/DC Converter with Three-Winding-Coupled Inductor and Charge Pump", IEEE Transactions on Power Electronics, vol. 31, No. 1, Jan. 1, 2016, pp. 461-469.

\* cited by examiner

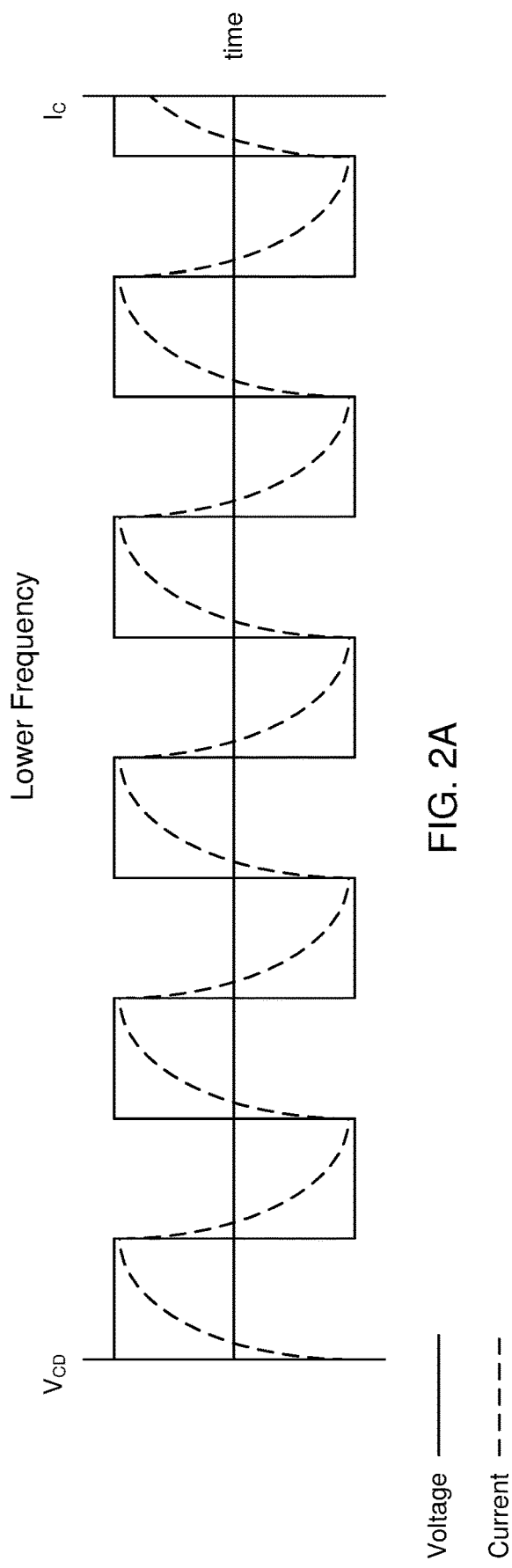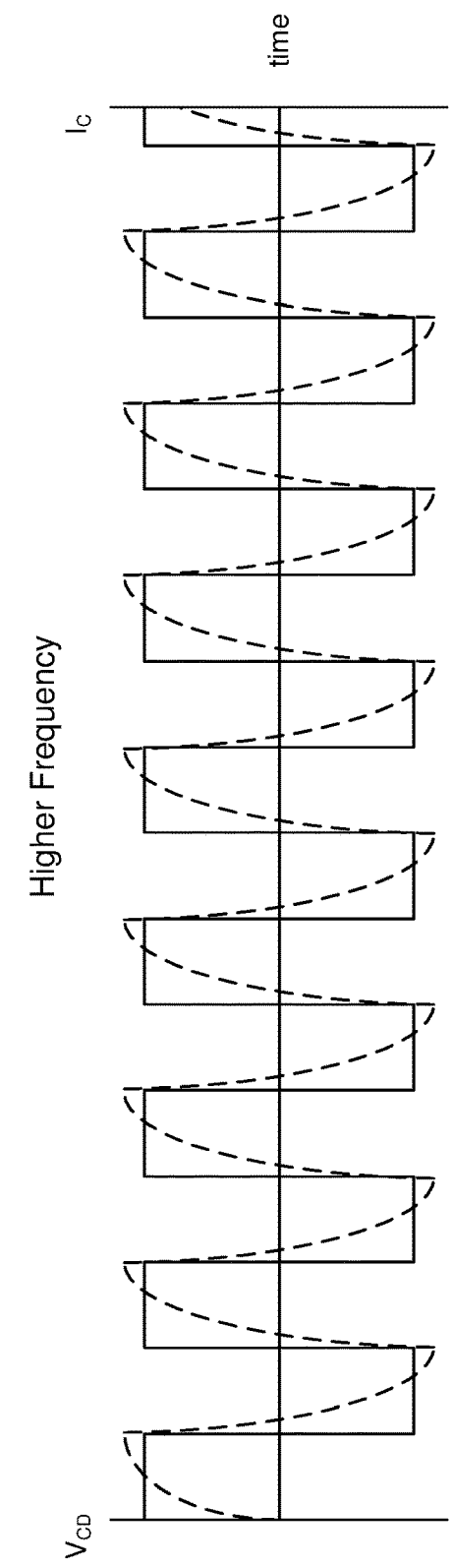
FIG. 2A — Lower Frequency
FIG. 2B — Higher Frequency
Voltage ——  Current - - - -

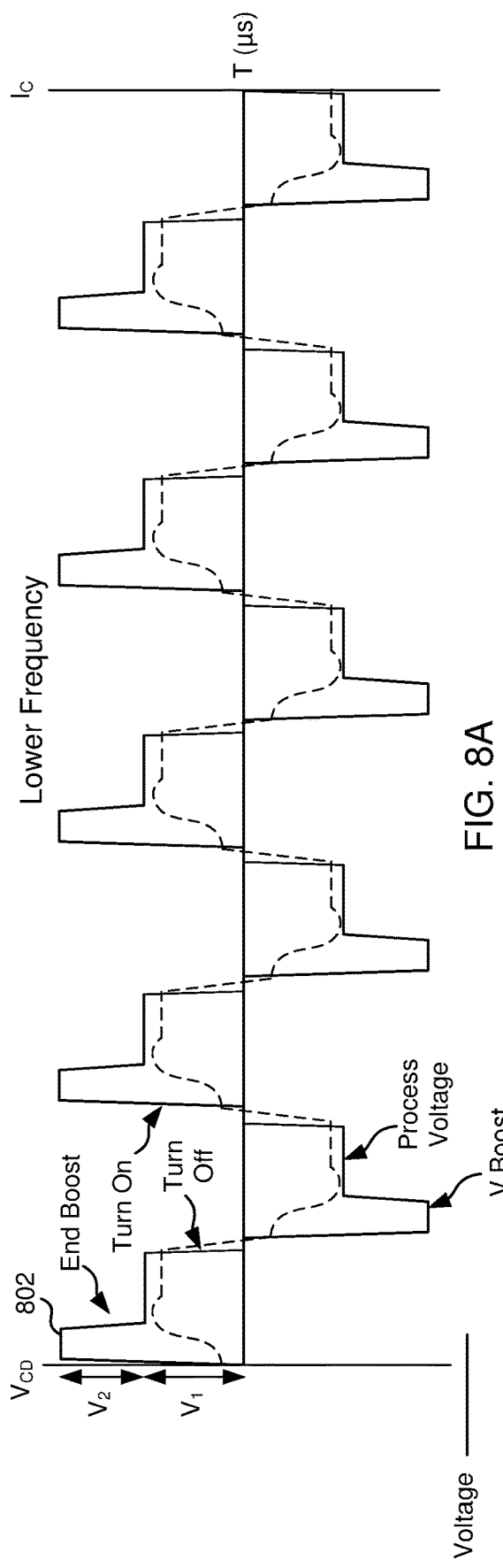
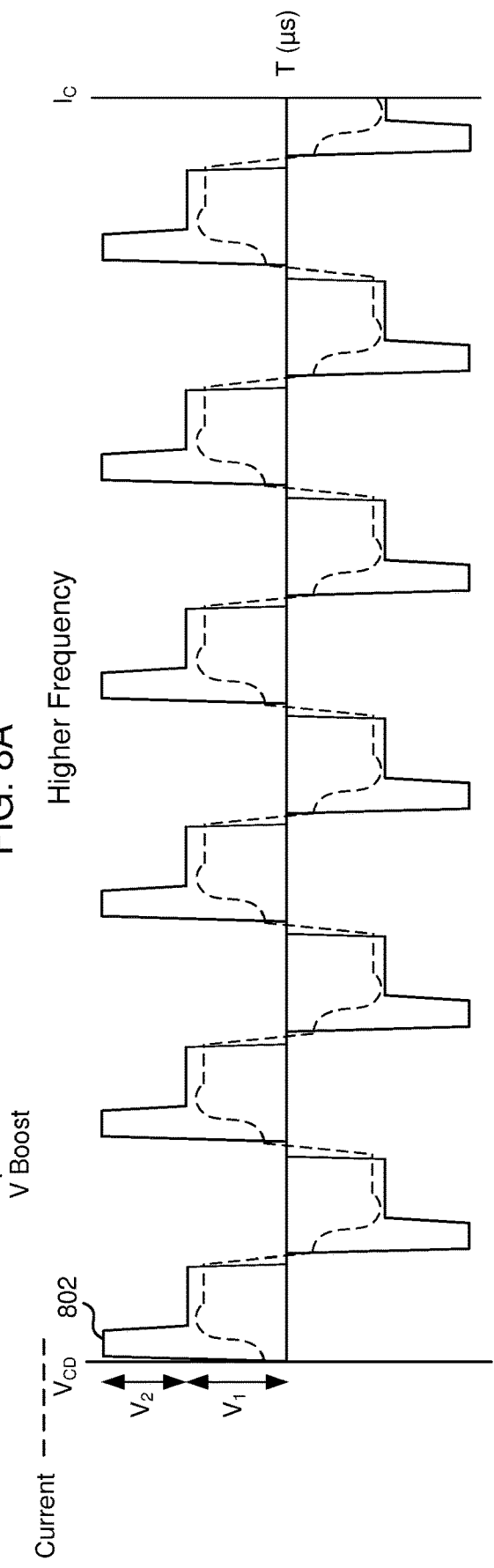
FIG. 8A
FIG. 8B

Single quadrant switch

Single quadrant switch

Single quadrant switch

Current bi-directional two quadrant switch

Current bi-directional two quadrant switch

Voltage bi-directional
two quadrant switch

Voltage bi-directional two quadrant switch

Four quadrant switch

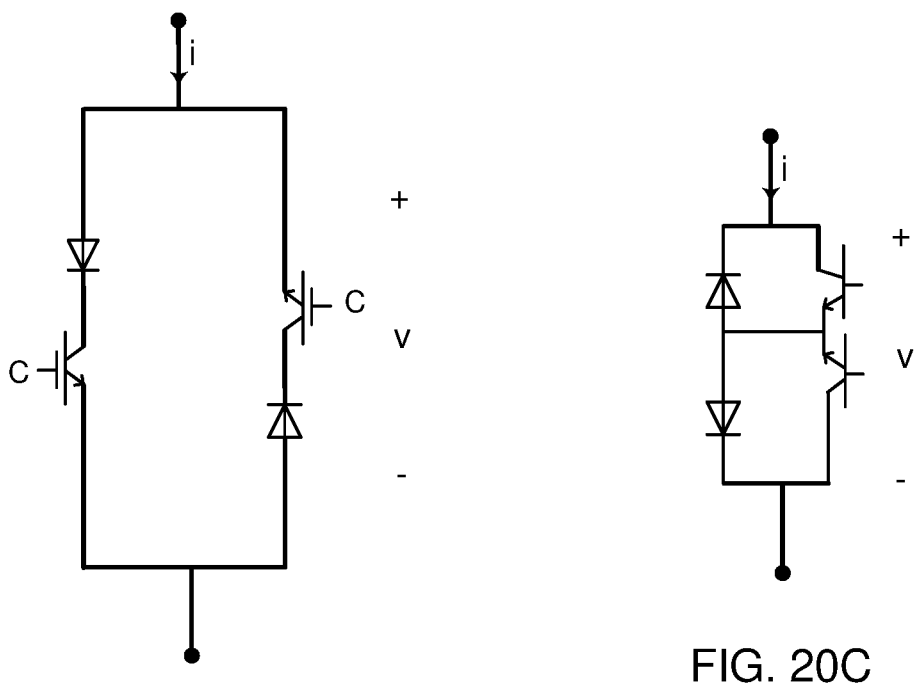
FIG. 20B
FIG. 20C
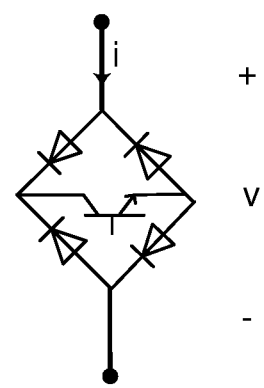
FIG. 20D

SIMPLIFIED VOLTAGE-BOOSTING SNUBBER NETWORK

CLAIM OF PRIORITY UNDER 35 U.S.C. § 120

The present Application for Patent is a continuation of U.S. patent application Ser. No. 17/412,813 entitled "SIMPLIFIED VOLTAGE-BOOSTING SNUBBER NETWORK" filed Aug. 26, 2021 and assigned to the assignee hereof and hereby expressly incorporated by reference herein.

FIELD OF THE DISCLOSURE

The present disclosure relates generally to power supplies. In particular, but not by way of limitation, the present disclosure relates to systems, methods and apparatuses for boosting current rise in a pulsed power supply.

DESCRIPTION OF RELATED ART

FIG. 1 illustrates one example of a typical power supply system 100 used for plasma processing. The power supply system 100 includes a DC power supply 102 providing DC power to a switching circuit 104 that converts the DC power into pulsed DC and provides the pulsed DC to a plasma load 106. When switching, the potential between nodes C and D passes through a potential of zero, and the plasma can be extinguished or can dim to an extent that it becomes highly resistive and acts like an unfluxed inductor or an open circuit for a short time after this transition Immediately after this transition to a highly resistive load, the DC power supply 102 continues to provide power to the switching circuit 104, but most of that power can no longer be delivered to the plasma load 106. Instead, the power predominantly passes through the switching circuit 104 potentially damaging the switching circuit 104.

A snubber 108 can be used to mitigate damage to the switching circuit 104 by absorbing power from the DC power supply 102 during the period after the switching circuit 104 transitions through 0 V. However, existing snubbers are typically dissipative snubbers and/or dissipate significant power.

Additional challenges to known power supply systems include slow processing throughput and further inefficiencies from power dissipation. For instance, and as seen in in the plot of FIG. 2A, while voltage between nodes C and D can switch with negligible ramp time, current ramps at a much slower pace, thus providing an average power that is significantly lower than the power output from the DC power supply 102. This leads to longer processing periods and decreased throughput, since many processes end when a predetermined total power has been delivered.

There is also a desire to increase DC pulse frequency provided to the plasma load 106 since this reduces arcing. However, the above-noted problems become more acute at higher frequencies, as illustrated in FIG. 2B. Furthermore, since each pulse is shorter at higher frequency, the peak current at high frequency may be higher (in a power-regulated system) than when lower frequencies are used. Since power dissipation is proportional to $I^2$, these larger currents lead to larger power losses. Additionally, switching losses, which are proportional to the current at the moment of switching, are accentuated at higher frequencies since switching current is larger.
Existing Snubber Systems A snubber/voltage-boosting topology developed by ADVANCED ENERGY of Fort Collins, CO, and disclosed in U.S. Pat. Nos. 9,854,659 and 10,194,518, which are incorporated herein by reference in their entirety, solve some of the above challenges. In particular, this known topology achieves snubber functionality while also boosting voltage and hence current during early portions of a pulse in order to achieve faster current ramping. The voltage is then reduced to a process voltage once the desired target current is achieved. FIG. 7 shows the known ADVANCED ENERGY topology, and FIGS. 3-6 shows the development toward this solution. Notably, FIG. 3 shows a basic capacitor-based snubber and FIGS. 4-6 develop toward the two-capacitor voltage-boosting topology that also achieves snubber functionality shown in FIG. 7. This solution includes a snubber/voltage-boosting circuit 700 arranged between a DC power supply 702 and a switching circuit 704, the switching circuit 704 designed to convert DC power into pulsed DC power for provision to a load such as the illustrated plasma load 706. The snubber/voltage-boosting circuit 700 includes two IGBT modules 726, 728, two pairs of dual-diode modules 710 and 718, two capacitors 708, 716, and three inductors L1, L2, and L3.

A voltage multiplier 724, comprising the two capacitor 708, 716, and one of the dual diode modules 718, absorbs power from the DC power supply 702 after the switching circuit 704 voltage switches, but also boosts process voltage, $V_1$, to a boosted voltage, $V_1+V_2$, for a first portion of each pulse (see 802 in FIG. 8A) so that current ramps more quickly. $V_2$, can be referred to as a boost voltage. For instance, the DC power supply 702 provides the process voltage $V_1$, while the voltage multiplier 724 boosts this voltage by $V_2$ during the first portion 802 of each pulse, such that a boosted voltage $V_1+V_2$ is provided to the switching circuit 704 during the first portion 802 of each pulse.

The boost is provided by the snubber 700 absorbing power from the DC power supply 702 immediately after 0 V transitions of the switching circuit 704. When the switching voltage reaches 0 V, the plasma density drops substantially and the plasma acts more like an open circuit or an unfluxed inductor than as a low resistance current path. The DC power supply 702 is current or power regulated and thus continues to drive the same current level. The snubber circuit absorbs this power, which otherwise would be directed into the switching circuit 704 and potentially damages that circuit.

As current passes into the voltage multiplier 724, energy is stored within the capacitors 708 and 716 and accumulates a voltage larger than the process voltage $V_1$ until the current in the plasma has ramped sufficiently to raise the plasma density back to a level where power can again be largely provided to the plasma load 706 rather than to the snubber. This time is long enough that the voltage across the voltage multiplier 724 builds to greater than the process voltage, $V_1$, and thus for a first portion 802 of each DC pulse, there is a boost voltage of $V_2$ as seen in FIGS. 8A and 8B.

This increased voltage causes the current to ramp faster than in previous designs (e.g., FIG. 2A), and as a result, the current flattens out sooner in each pulse meaning that greater average power is delivered and thus less time is required for a given process. The increased current ramp rate also means that current does not rise as high as it would given a slower ramp rate, which results in less overall losses (proportional to $I^2$) and less switching losses (proportional to I at the moment of switching). These improvements in efficiency are especially noticeable at higher frequencies (compare FIG. 8B to FIG. 2B).

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some aspects of the disclosure can be characterized as a snubber for a pulsed DC power supply system comprising an input coupled to a DC power supply, an output coupled to a switching circuit, a low-level connection of the DC power supply, first and second inductive elements, a capacitive element, a first switch, a second switch, and a third switch. The switching circuit can be configured to provide pulsed DC power to a load. The first inductive element can be coupled between a first node and a second node, and the second inductive element can be coupled between the first node and a third node. The third node can be coupled to the output. The capacitive element can be coupled between the first node and a fourth node. The first switch can be coupled between the third and fourth nodes. The second switch can be coupled between the second and fourth nodes. The third switch can be coupled between the second node and the low-level connection of the DC power supply.

Other aspects of the disclosure can be characterized as a pulsed DC power supply system configured to provide pulsed DC to electrodes in a plasma processing chamber. The pulsed DC power supply system can include a DC power supply, a first switching circuit, and a voltage-boosting circuit. The DC power supply can be configured to provide a process voltage, $V_1$, to a first and a second rail. The first switch circuit can be coupled to the first and second rails, and can be configured to convert the process voltage, $V_1$, and any other voltage on the first and second rails, to a pulsed output for provision to the electrodes in the plasma processing chamber. The voltage-boosting circuit can be coupled between the first and second rails and can include a capacitive element, two inductive elements, and three switches. The two inductive elements and the capacitive element can be connected at a first node. The voltage-boosting circuit is configured to draw current from the DC power supply when an impedance of the plasma processing chamber increases, thereby raising a voltage between the first and second rail by a boost voltage, V2, where the boost voltage, V2, is selectable by a duty cycle of two of the three switches.

Yet other aspects of the disclosure can be characterized as a method of providing pulsed power to a plasma processing chamber. The method can include providing a snubber circuit coupled to a switching circuit, the snubber circuit configured to be coupled between a DC power supply and the switching circuit, and the switching circuit configured to be coupled between the snubber circuit and the plasma processing chamber, the snubber circuit comprising two switches whose duty cycle is configured to control a voltage across a capacitor of the snubber circuit and thereby to regulate a DC voltage provided at an output of the switching circuit to the plasma processing chamber. The method can also include accessing, for the switching circuit, a target boost voltage, target pulsed output duty cycle, target pulsed output frequency, and target output current. The method can yet further include setting a duty cycle of the two switches to achieve the target boost voltage at the output of the switching circuit and delivering a first pulsed DC voltage to an electrode in the plasma processing chamber.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 2A illustrates plots of voltage and current for a traditional power supply system at lower frequency;

FIG. 2B illustrates plots of voltage and current for a traditional power supply system at higher frequency;

FIG. 8A illustrates a plot of voltage and current for the power supply systems of this disclosure at lower frequency;

FIG. 8B illustrates a plot of voltage and current for the power supply systems of this disclosure at higher frequency;

FIG. 20B illustrates a four-quadrant switch realized by connecting two current-bidirectional switches back-to-back;

FIG. 20C illustrates a four-quadrant switch realized by connecting two voltage-bidirectional two-quadrant switches in an anti-parallel manner; and FIG. 20D illustrates a four-quadrant switch realized by coupling a transistor across two opposing terminals of a bridge rectifier (or diode bridge);

DETAILED DESCRIPTION

The present disclosure relates generally to power supply systems. More specifically, but without limitation, the present disclosure relates to a non-dissipative snubber and voltage booster for use in a power supply system.

The word "exemplary" is used herein to mean "serving as an example, instance, or illustration." Any embodiment described herein as "exemplary" is not necessarily to be construed as preferred or advantageous over other embodiments.

For the purposes of this disclosure, a current limiter is any device or circuit that limits a current that can pass through the current limiter or that limits a rate at which current passing through the current limiter can rise or fall. In some embodiments, a current limiter can limit both the rate of increase and an upper bound of the current passing through the current limiter. An inductor, resistor, JFET, MOSFET, and IGBT are all examples of current-limiting elements since each are able to limit the rate of change of and amount of current.

For the purposes of this disclosure, a switch includes any circuit or device that stops the passage of current when in an off or open state. For instance, transistors (e.g., MOSFET, BJT, IGBT) can be a switch, and in some cases, where a current limiter is operated so as to reduce current to 0 A, a current limiter can be a switch.

For the purposes of this disclosure, a switch includes any device or circuit that only passes current in a single direction. For instance, both a diode and a transistor can be considered a switch, depending on operation.

Figure 1:
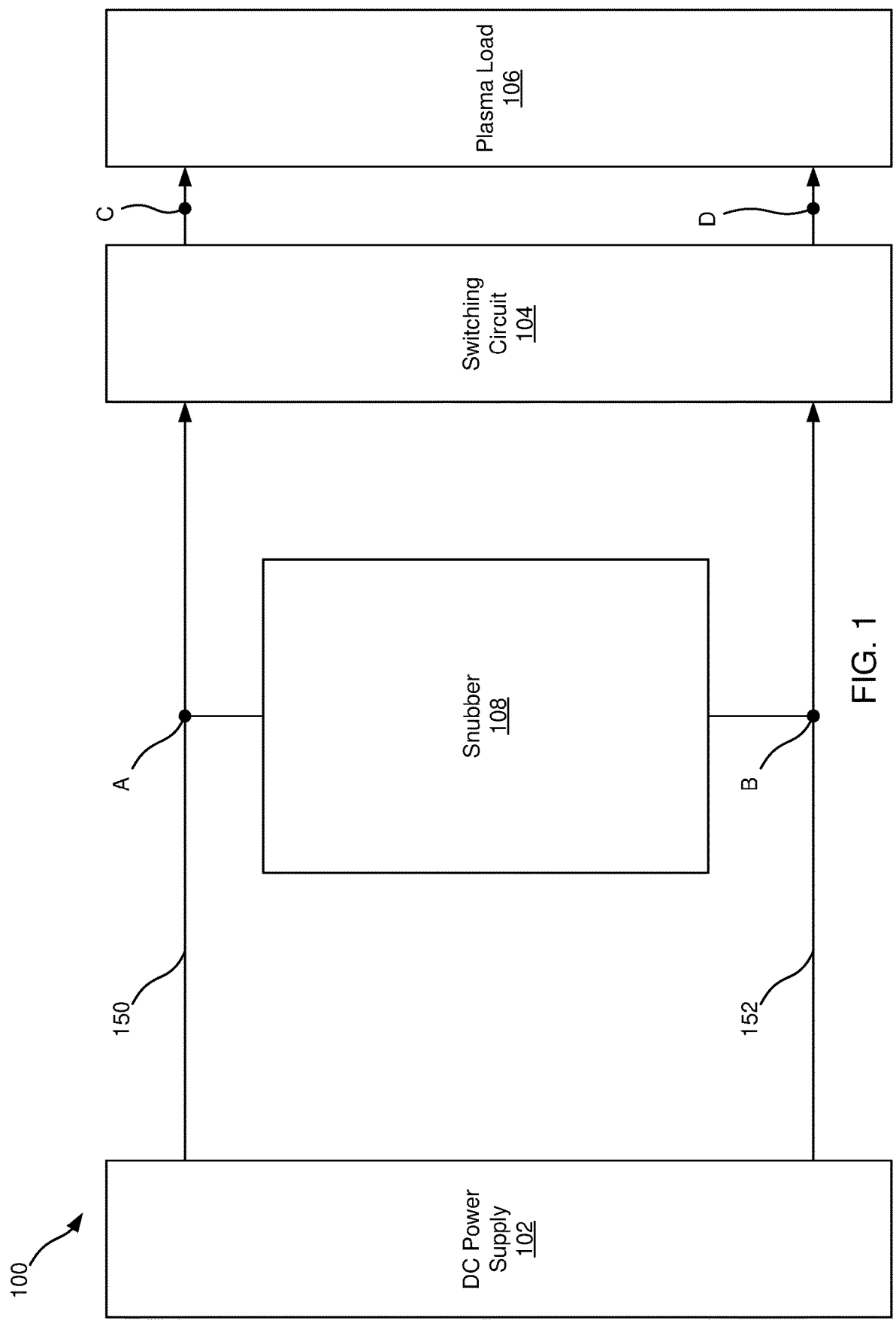
FIG. 1 illustrates one example of a typical power supply system used for plasma processing.
Figure 3:
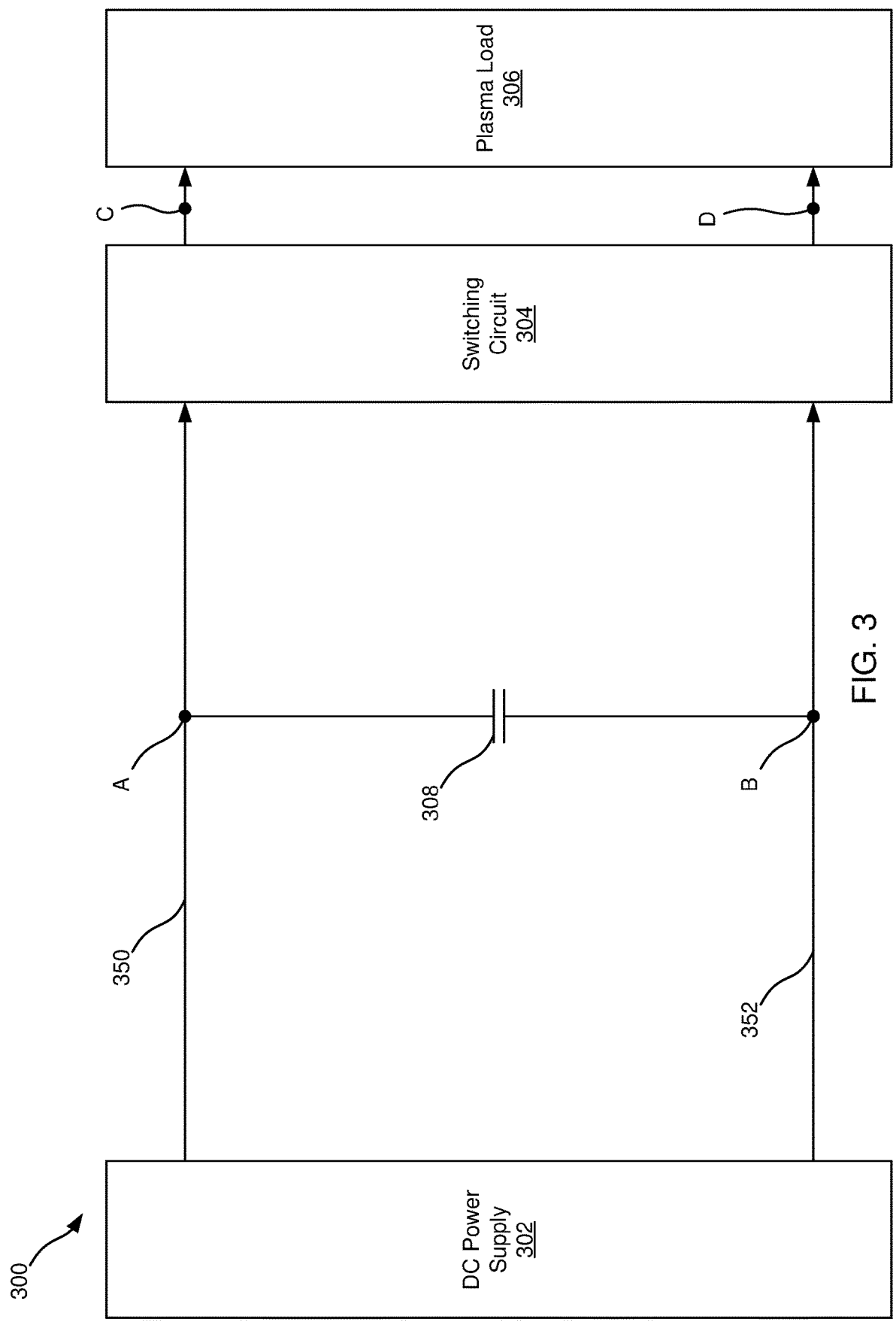
FIG. 3 illustrates a power supply system including a DC power supply and a snubber comprising a capacitor.
Figure 4:
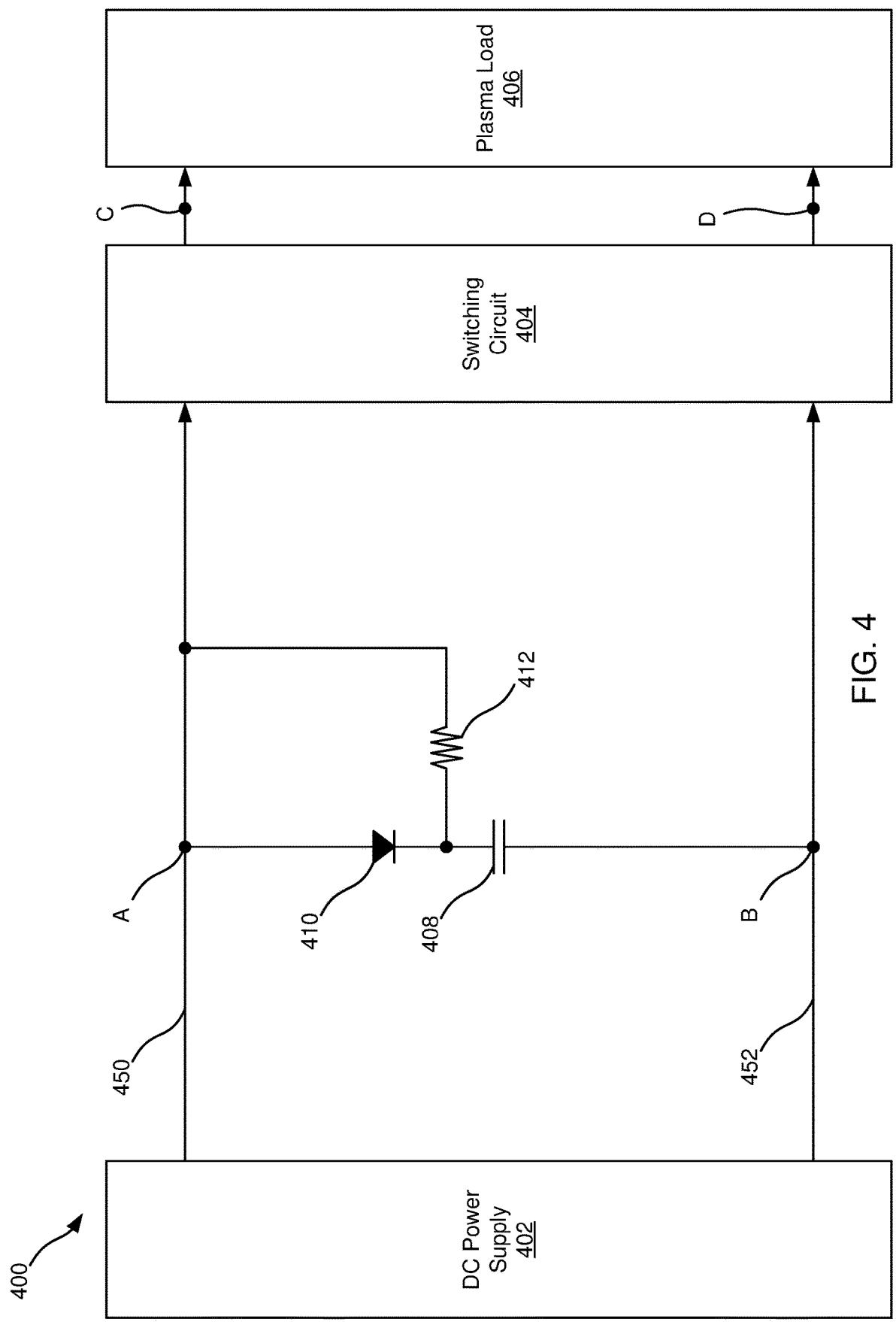
FIG. 4 illustrates a power supply system including a DC power supply and a snubber comprising a diode, resistor, and capacitor.
Figure 5:
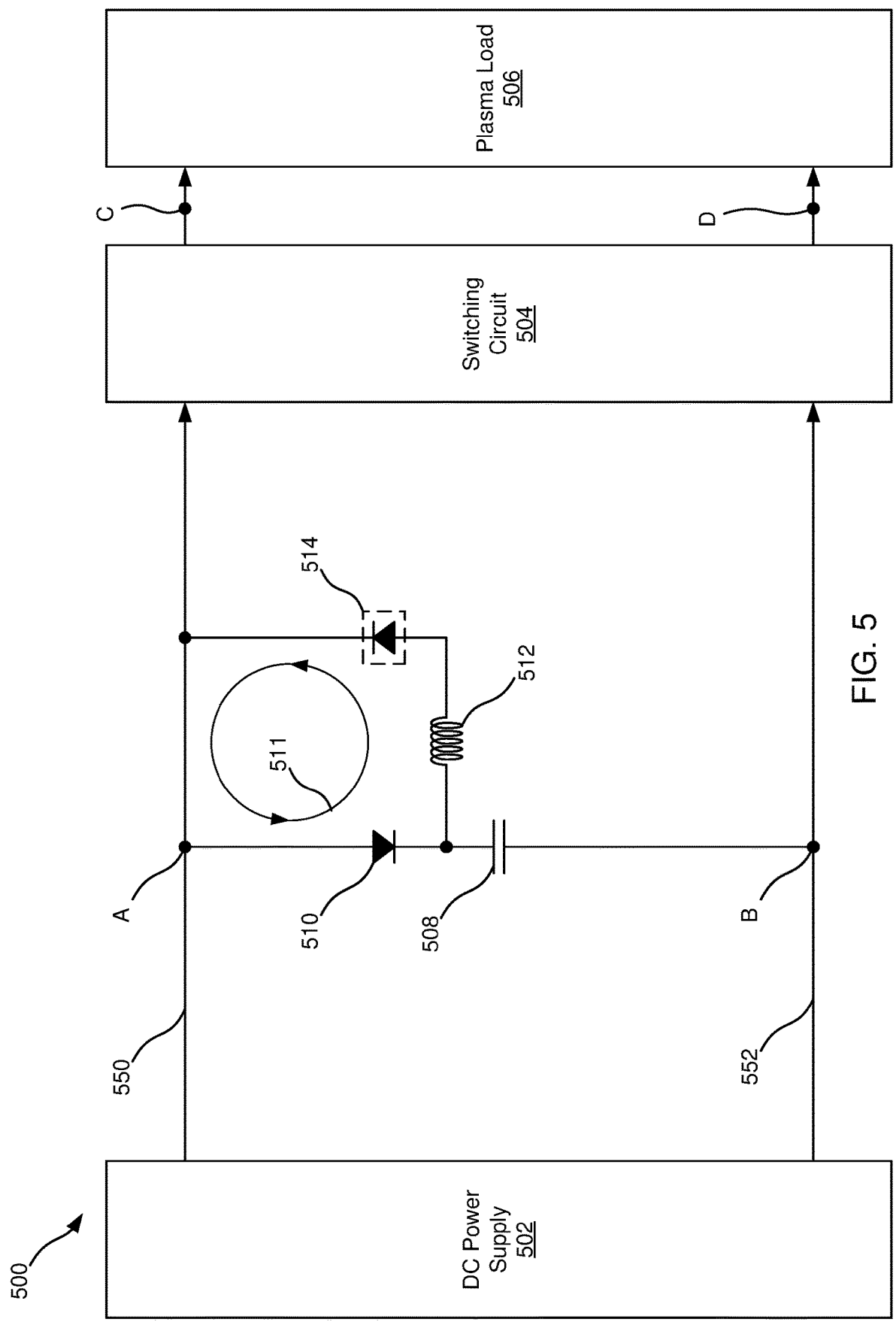
FIG. 5 illustrates a power supply system including a DC power supply and a snubber comprising two diodes, a resistor, and a capacitor.
Figure 6:
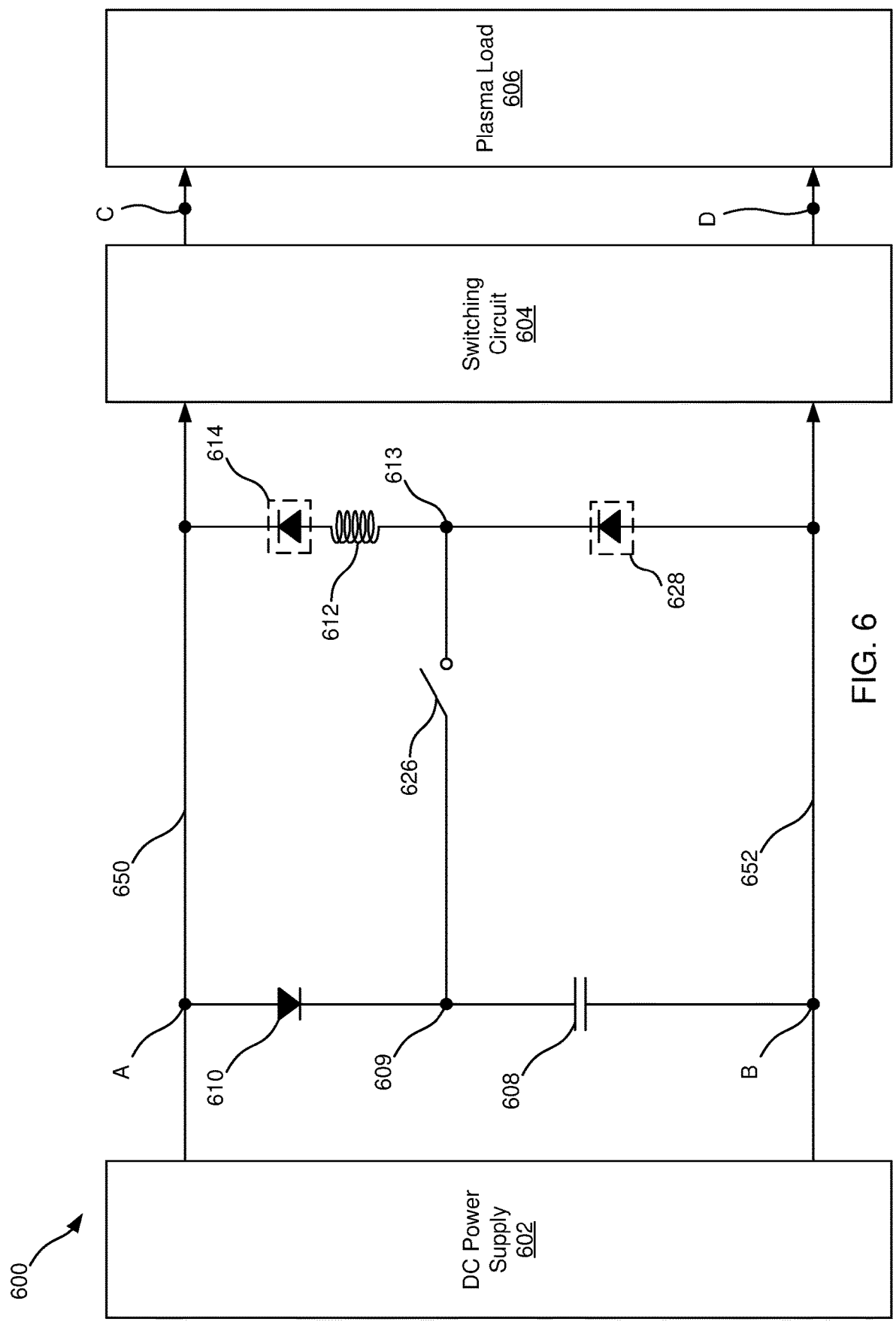
FIG. 6 illustrates a power supply system including a DC power supply and a snubber comprising at least a diode, a capacitor, a switch and an inductor.
Figure 7:
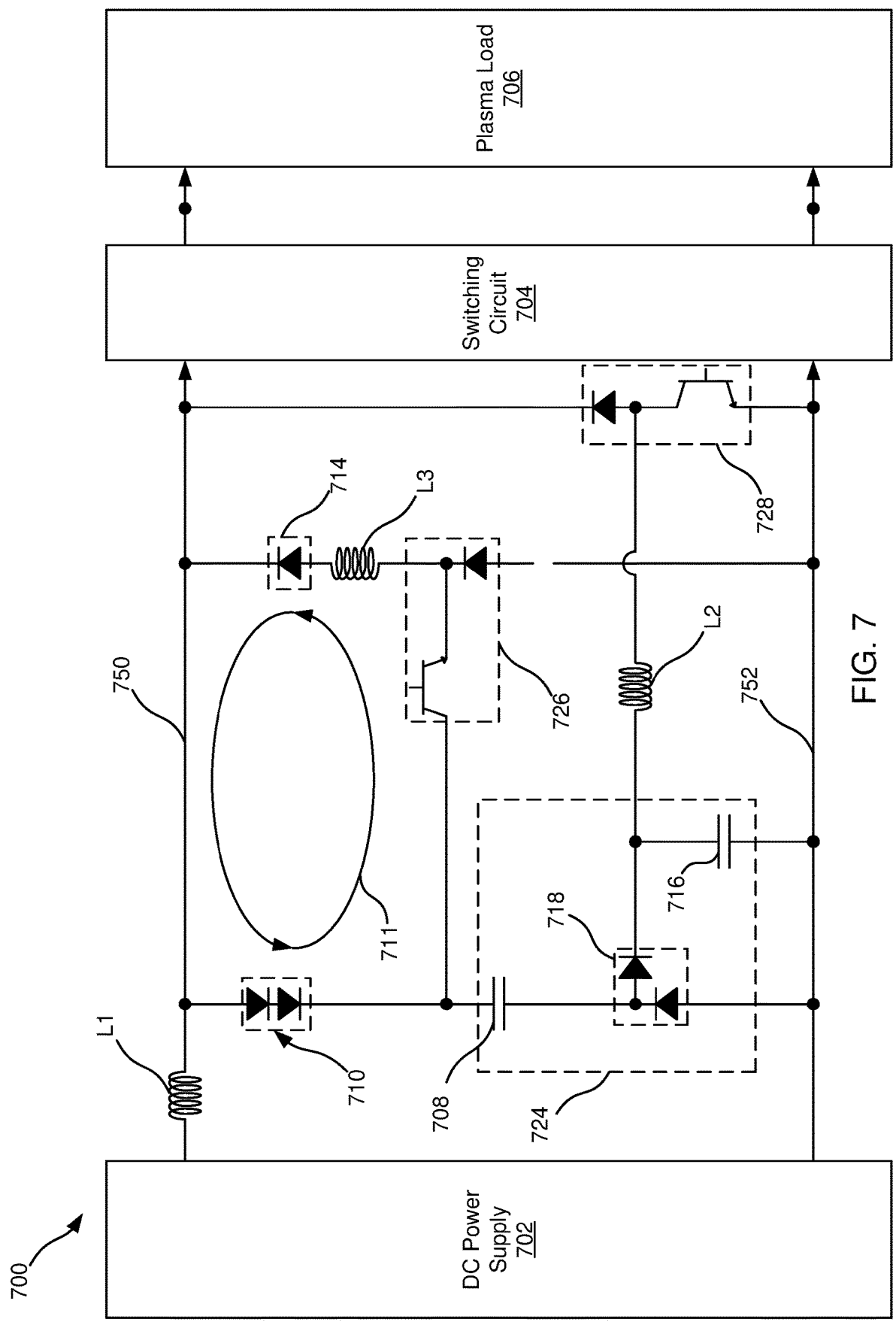
FIG. 7 illustrates a power supply system including a DC power supply and a snubber comprising two pairs of series-coupled diodes, two transistors with in-line didoes, two capacitors, and two inductors.

Development of the topology shown in FIG. 7 started with the simple capacitor-based snubber of FIG. 3. Additional components were tacked on to add voltage-boosting functionality. However, because this development started from the foundation of a snubber, the inventors of this disclosure recognized that there might be a more effective way to achieve snubber and voltage-boosting effects if they started from scratch with the dual purpose of designing a snubber and voltage-boosting circuit.

Figure 9:
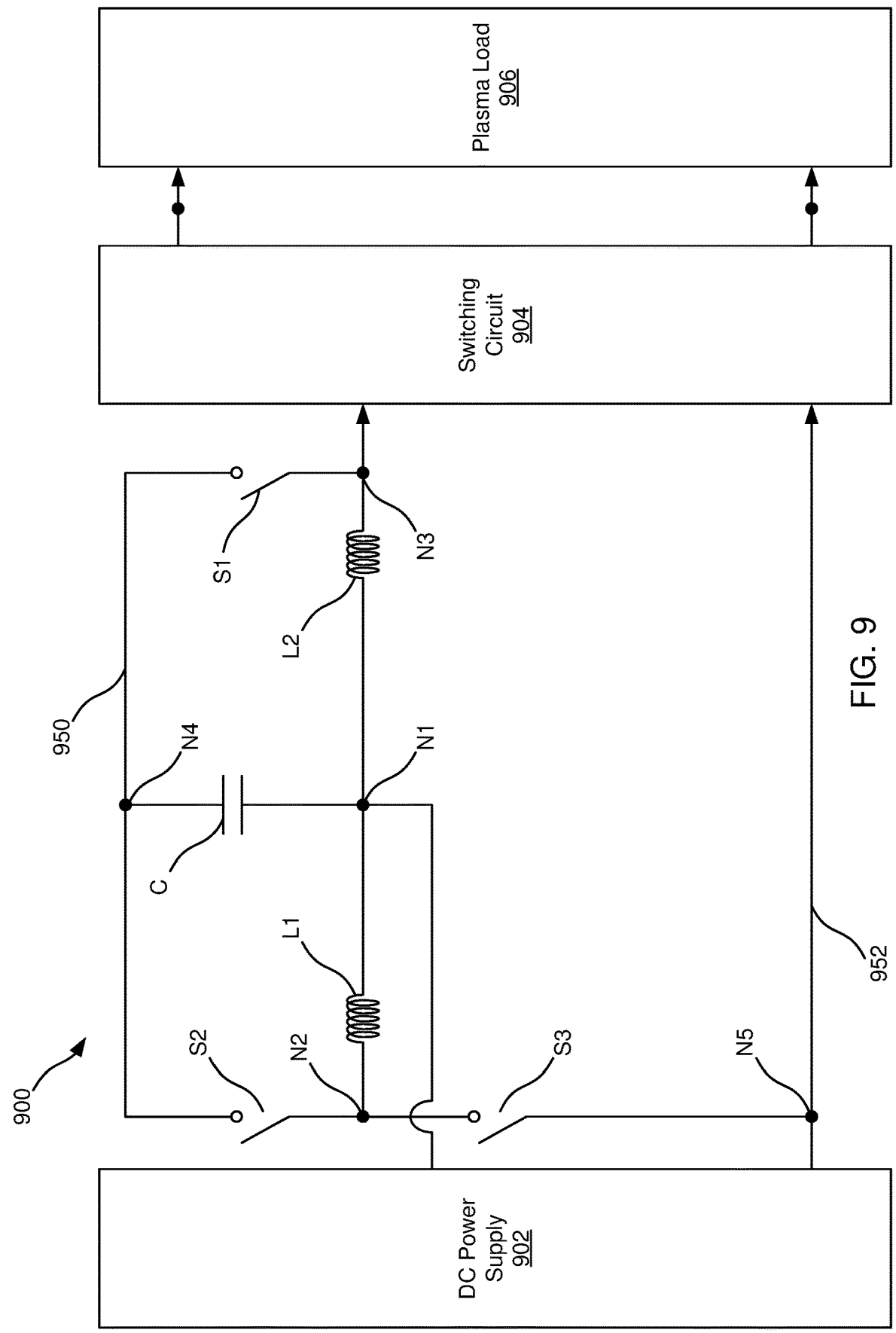
FIG. 9 illustrates an embodiment of a power supply system including a DC power supply, a switching circuit, and a snubber/voltage-boosting circuit arranged therebetween and comprising two inductive elements, one capacitive element, and three switches.
Figure 10:
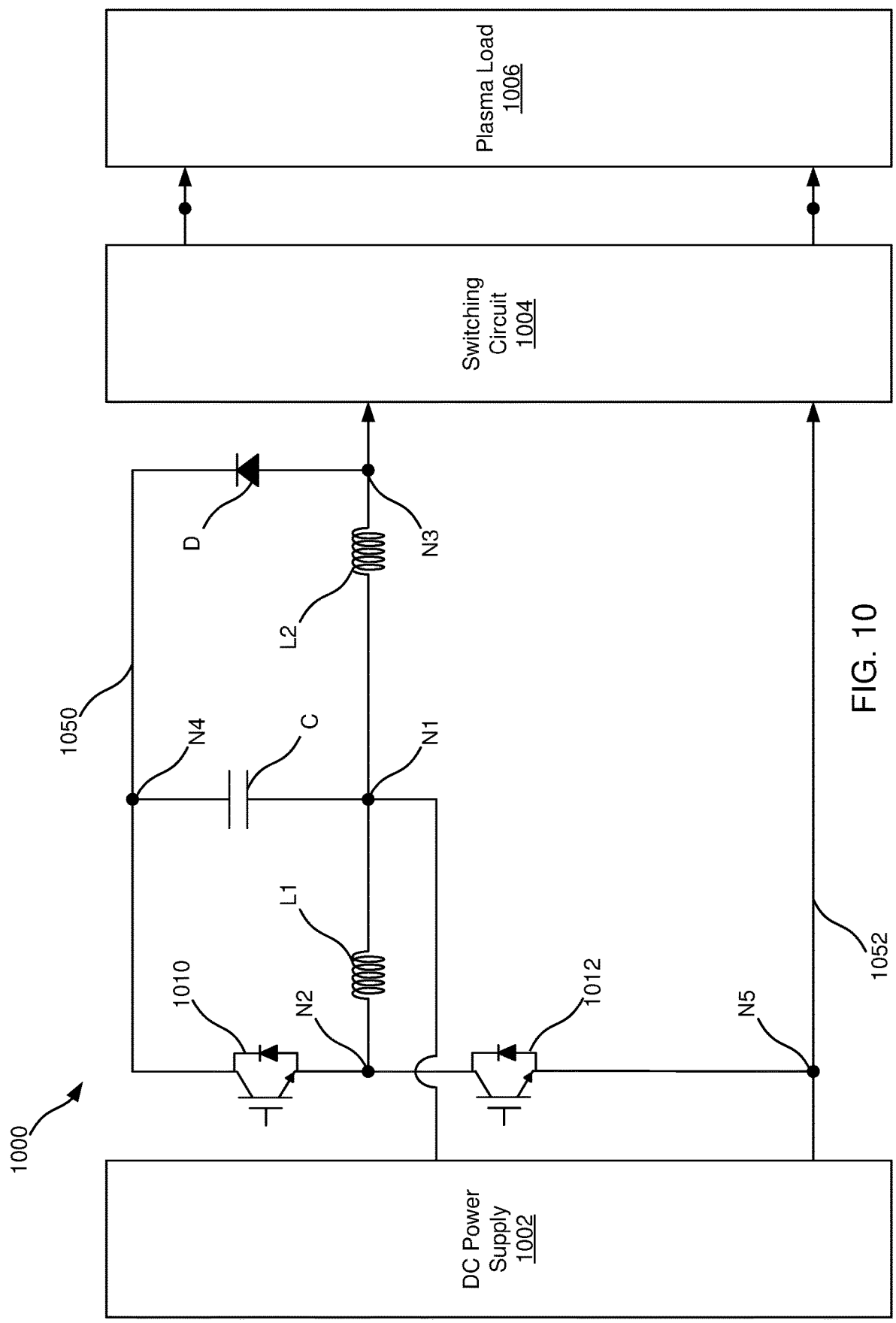
FIG. 10 illustrates an embodiment of a power supply system including a DC power supply, a switching circuit, and a snubber/voltage-boosting circuit arranged therebetween and comprising two inductive elements, one capacitive element, one diode, and two IGBTs.
Figure 11:
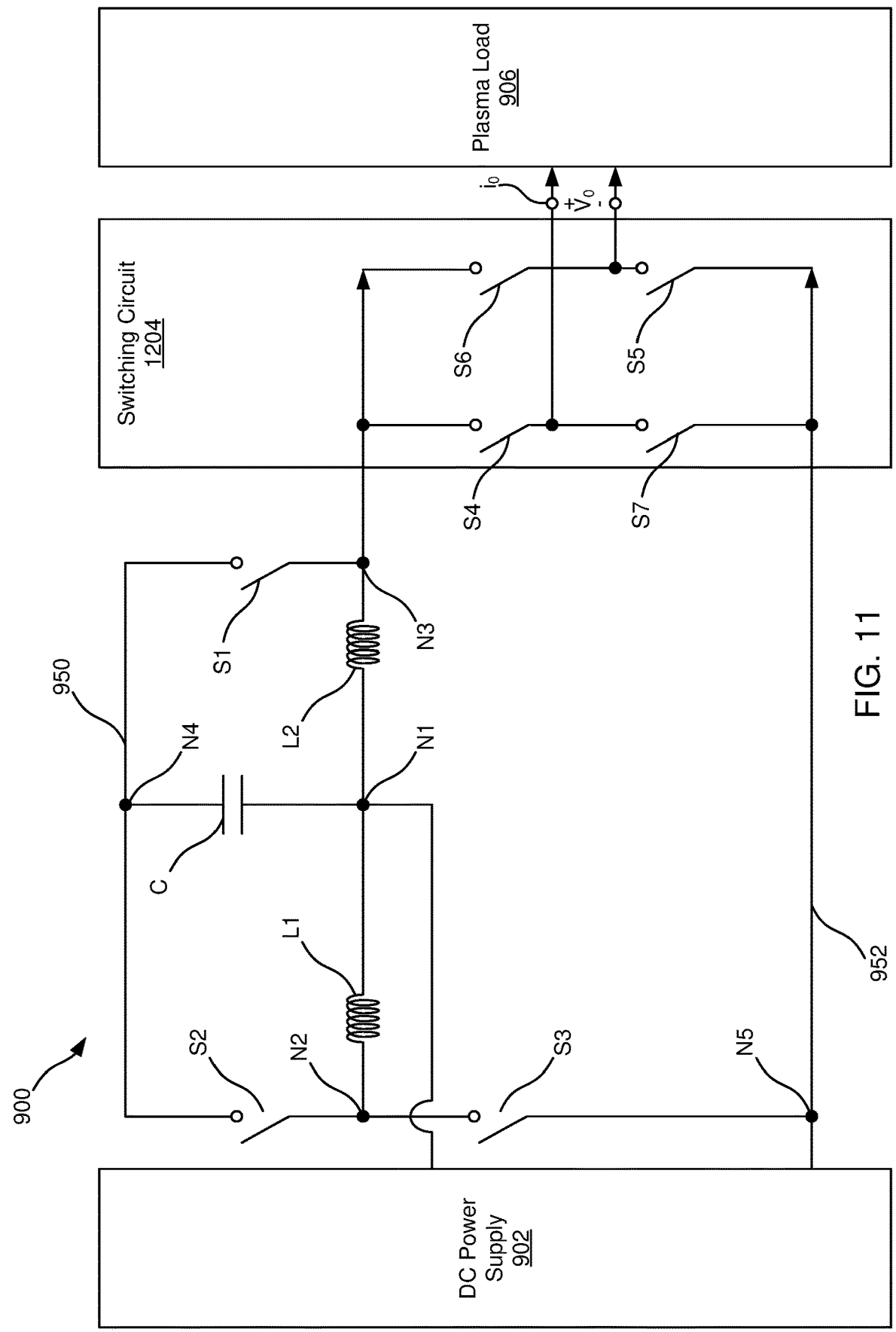
FIG. 11 illustrates details of a switching circuit such as the ones shown in FIGS. 9 and 10.
Figure 12A:
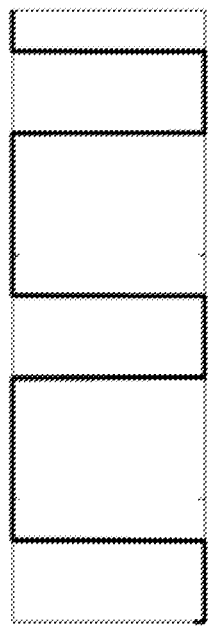
FIG. 12A illustrates a timing chart for the second switch of FIGS. 9-11.
Figure 12B:
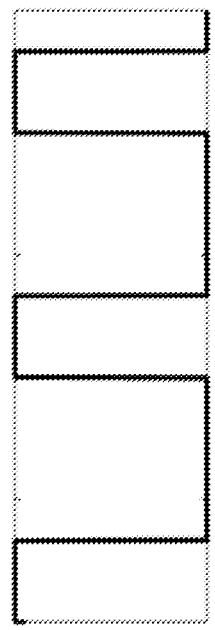
FIG. 12B illustrates a timing chart for the third switch of FIGS. 9-11
Figure 12C:
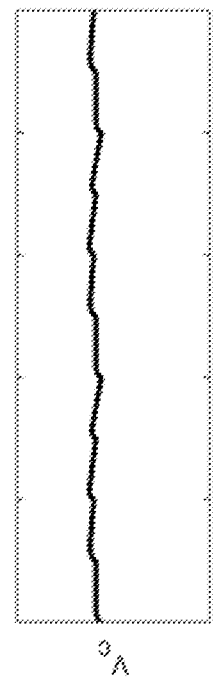
FIG. 12C illustrates a timing chart for the voltage across the capacitive element, C, of FIGS. 9-11.
Figure 12D:
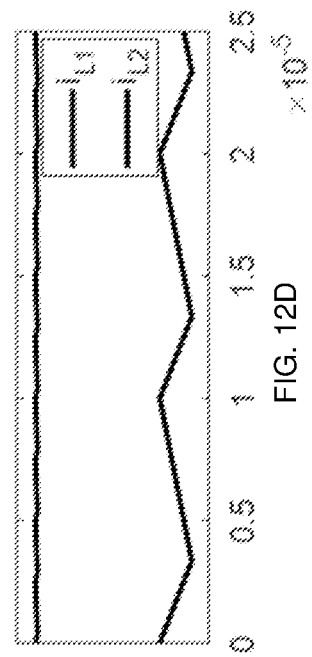
FIG. 12D illustrates a timing chart for the currents in the first and second inductive elements FIGS. 9-11.
Figure 12E:
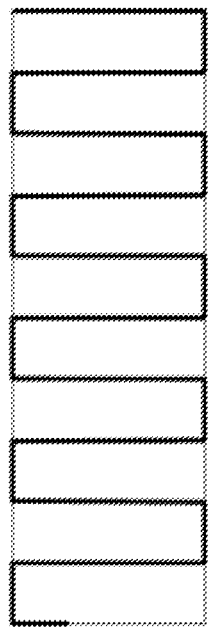
FIG. 12E illustrates a timing chart for a first pair of switches in the switching circuit of FIG. 11.
Figure 12F:
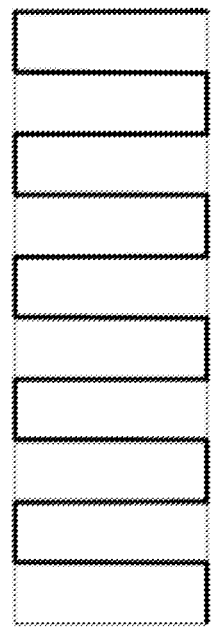
FIG. 12F illustrates a timing chart for a second pair of switches in the switching circuit of FIG. 11.
Figure 12G:
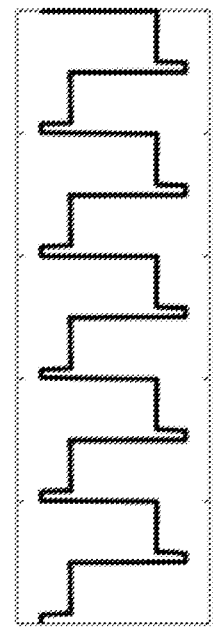
FIG. 12G illustrates a timing chart for an output voltage of the switching circuit of FIGS. 9-11.
Figure 12H:
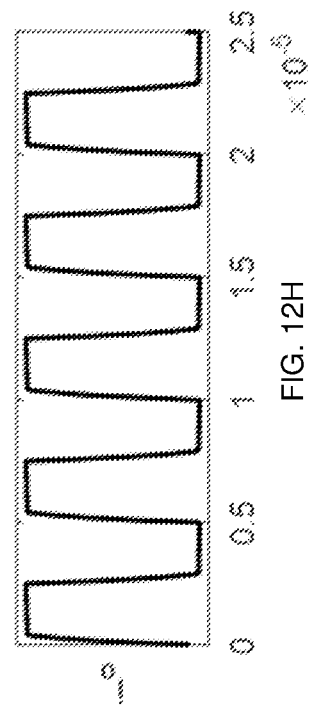
FIG. 12H illustrates a timing chart for an output current of the switching circuit of FIGS. 9-11.

FIGS. 9, 10 and 11 arose from the desire to equal or improve upon the functionality of the topology in FIG. 7, but do so in a more elegant design and using fewer components. With this dual-purpose goal in mind from the start, a snubber/voltage-boosting circuit 900 was developed that reduces the count of inductors, capacitors, and diode blocks. The reduced capacitor count is made possible via realization that the DC power supply 902 and 1002 can provide the process voltage, $V_1$, while only a single capacitive element C is used to provide the boost voltage, $V_2$. This means that unlike traditional boost converters, where the entire voltage drops across a capacitor, here only the boost voltage, $V_2$, is stored on the capacitive element C, which allows a lower-valued, smaller, and less-costly capacitive device to be used. At the same time, this lone capacitive element C can also provide snubber functionality.

In particular, the power supply system includes a DC power supply 902 providing DC power to a switching circuit 904 via a snubber/voltage-boosting circuit 900. A voltage of the DC power supply 902 can be set to achieve a target output current at the output of the switching circuit 904. The switching circuit 904 converts the DC power to pulsed DC voltage at a pulsed output of the switching circuit 904 for provision to a load such as the illustrated plasma load 906 (e.g., via one or more electrodes of a plasma processing chamber). The snubber/voltage-boosting circuit 900 will be referred to as a "snubber" for the sake of simplicity, but it should be understood that "snubber" and "voltage-boosting circuit" can be used interchangeably relative to FIGS. 9, 10, and 11 since the circuit 900 performs both functions. The snubber 900 can be arranged between a first power rail 950 and a second power rail 952 (sometimes referred to as a low-level connection), with the second power rail 952, or low-level connection, coupled to a low-level connection of the DC power supply 902. The snubber 900 can include an input at a first node N1 that receives power, or the high-level input, from the DC power supply 902. The snubber 900 can also include an output at a third node N3, this output being a high-level output and being coupled to the switching circuit 904. A first inductive element L1 (e.g., a first inductor) is coupled between the first node N1 (or input) and a second node N2. A second inductive element L2 (e.g., a second inductor) is coupled between the first node N1 and the third node N3 (or output). A capacitive element C (e.g., a capacitor) is coupled between the first node N1 and a fourth node N4. A first diode or switch S1 is coupled between the third node N3 (or output) and the fourth node N4, and allows current to pass from the third node N3 to the fourth node N4, but not from the fourth node N4 to the third node N3. In particular, a negative terminal of the first switch, S1, or an anode of the first diode, S1, can be coupled to the third node, N3. The snubber/voltage-boosting circuit 900 is configured to draw current from the DC power supply 902 when an impedance of the plasma load 906 increases, thereby raising a process voltage, $V_1$, between the first and second rail 950, 952 by a boost voltage, $V_2$, where the boost voltage, $V_2$, is selectable by a duty cycle of the second and third switches, S2 and S3. The result is a boosted voltage, $V_1+V_2$ for a first portion of each pulse.

In some embodiments, the second and third switches S2, S3 can be implemented by insulated gate bipolar transistors (IGBTs) as shown in FIG. 10, or by any single-quadrant (e.g., quadrant I) switch. However, other switch types can also be implemented, such as MOSFETs and other dual-quadrant (e.g., quadrant I and IV) switches. For instance, the second and third switches S2, S3 can be current-bidirectional two-quadrant switches. Similarly, FIG. 10 shows the switch S1 implemented as a diode D, with the anode coupled to the third node (or output), although other single-quadrant switches (e.g., quadrant II) can also be implemented.

It should be noted that the capacitive element C in FIGS. 9, 10, and 11 is coupled to the first power rail 1050 rather than the low-level connection 1052 as is often seen in traditional boost converters.

Previously-described snubbers tend to circulate power through the power supply during snubbing operation, whereas the embodiments in FIGS. 9, 10, and 11 circulate current through the second inductive element L2, the first switch or diode S1/D, and the capacitive element C. This resonant loop stores circulating energy making the disclosed topology of FIGS. 9, 10, and 11 more efficient than previous designs.

Optionally, a switch (e.g., JFET, MOSFET, or IGBT) can be arranged across the second inductive element L2, allowing the node N3 voltage to be pulled to the N4 node voltage at any time and independent from the plasma load 906 and the current through second inductive element L2.

The first switch, S1 in FIG. 9, can be embodied by a diode (e.g., see FIG. 10) or by a variety of switches including an IGBT. Where a controllable switch is used, the first switch, S1, can remain open unless a current through the second inductive element, L2, is greater than current in the plasma load 906, such that current through the second inductive element L2 can be split between the plasma load 906 and a path through the closed first switch S1 and back to the capacitive element, C. When these two currents balance, the first switch S1 can be opened. The diode, D, in FIG. 10 operates in a similar fashion, allowing excess current through the second inductive element, L2, to pass through the diode, D, and back into the capacitive element, C.

Said another way, when S1 is closed, the voltage seen across the switching circuit 904, i.e., the H-bridge, may be pulled up to the highest voltage (i.e., the voltage at N4). In such cases, and when the cross-pair of switches of the H-bridge are closed, the voltage at N4 may also be the voltage seen across the load. In some examples, when S1 is a diode, it conducts when the current passing to the plasma load 906 is less than the current passing through the second inductive element, L2. For instance, near the zero-crossing of each cycle, current may primarily flow through the first switch, S1. As the switching circuit 904 delivers the boost voltage to the plasma load 906 and current to the plasma load 906 begins to ramp, progressively less current circulates through the first switch, S1, and more of the current through the second inductive element, L2, is delivered to the plasma load 906, until the first switch, S1, turns off (e.g., is reverse biased in the case of a diode).

In some examples, a controllable switch (e.g., a single quadrant switch, two quadrant switch, etc., further described in relation to FIGS. 16-20) may be used in place of a diode for the first switch S1. For instance, in some circumstances, it may be desirable to deliver the voltage at fourth node, N4, across the switching circuit 904, where a diode at S1 would be reverse biased. In this case, an actively-controlled switch, such as a MOSFET or IGBT, could replace the diode and allow the voltage at the fourth node, N4, to be delivered under a wider range of conditions.

During arcs, the switching circuit 904 can be turned off (i.e., all of the switches therein can be set to an open state). This precludes further power from being delivered to the arc, and preserves the DC power supply 902 by absorbing excess power in the capacitor C. The switching circuit 1004 operates in the same manner.

FIG. 10 illustrates an embodiment of a power supply system including a DC power supply, a switching circuit, and a snubber/voltage-boosting circuit arranged therebetween and comprising two inductive elements, one capacitive element, two switches and a diode. The power supply system includes a DC power supply 1002 providing DC power to a switching circuit 1004 via a snubber/voltage-boosting circuit 1000. The switching circuit 1004 converts the DC power to pulsed DC power for provision to a load such as the illustrated plasma load 1006 (e.g., via one or more electrodes of a plasma processing chamber). The snubber/voltage-boosting circuit 1000 can be arranged between a first power rail 1050 and a second power rail 1052 (sometimes referred to as a low-level connection). The snubber/voltage-boosting circuit 1000 can include an input at a first node N1 that receives power, or the high-level input, from the DC power supply 1002. The snubber/voltage-boosting circuit 1000 can also include an output at a third node N3, this output being a high-level output and being coupled to the switching circuit 1004. A first inductive element L1 (e.g., a first inductor) is coupled between the first node N1 (or input) and a second node N2. A second inductive element L2 (e.g., a second inductor) is coupled between the first node N1 and the third node N3 (or output). A capacitive element C (e.g., a capacitor) is coupled between the first node N1 and a fourth node N4. A first diode is coupled between the third node N3 (or output) and the fourth node N4, and allows current to pass from the third node N3 to the fourth node N4 when the diode D is forward biased (i.e., when the voltage between N3 and N5 is greater than that between N4 and N5).

A duty cycle of the IGBTs 1010 and 1012 sets a boost voltage that can be provided to the switching circuit 1004. In other words, the duty cycle of the IGBTs 1010 and 1012 controls charge storage and thus voltage on the capacitive element C.

FIG. 11 illustrates details of one embodiment of the switching circuit 904, 1004. In this embodiment, four switches, S4, S5, S6, and S7 are used in a full bridge configuration to convert the waveform between N3 and N5 (e.g., DC voltage) to pulsed DC (e.g., the waveform seen in FIGS. 8 and 12). The switches S4, S5, S6, and S7 can be single or dual-quadrant switches such as BJT, JFET, IGBT, and MOSFET to name a few non-limiting examples. The switching circuit 1204 produces a voltage $V_O$ and a current $i_O$ at its output that are provided to the plasma load 906 and the voltage $V_O$ and a current $i_O$ are plotted against timing of the switches S4, S5, S6, and S7 in FIG. 12.

Said another way, when S1 is closed/on, the voltage seen across the switching circuit 1204, i.e., the H-bridge, may be pulled up to the highest voltage (i.e., the voltage at N4). In such cases, and when the cross-pair of switches of the H-bridge are closed, the voltage at N4 may also be the voltage seen across the load 906. In some examples, when S1 is a diode, it may only conduct when the load current (e.g., $i_o$) is less than the current (e.g., $i_{L2}$) through the inductor ($L_2$). For instance, during the beginning of the cycle, $i_o=0$ and S4 and S5 are closed, current ($i_{L2}$) may circulate through the switch, S1 (e.g., a diode). Further, voltage ($V_O$) may be pulled to the voltage at N4. In such cases, the higher voltage across the load 906 may maximize $di_O/dt$. In some circumstances, a portion of the current ($i_{L2}$) may flow through the load and $i_O<i_{L2}$. After a short period of time, $i_O$ approaches or equals $i_{L2}$, and the switch S1 (e.g., a diode) stops conducting. In such cases, the voltage across the load 906 may also drop or go down to a lower value. According to aspects of this disclosure, the DC power supply 902 may be utilized to control $i_O$ and force $i_O$ to equal $i_{L2}$. In other words, the DC power supply 902 may act as a current source and may be able to raise its voltage (e.g., by raising its compliance voltage) such that $i_O$ increases and the condition $i_O=i_{L2}$ is met. Said another way, when the current through the inductor $L_2$ rises above $i_O$, the DC power supply 902 may be able to raise its compliance voltage (i.e., the maximum amount of voltage a current source can produce on its output) in its attempt to produce the desired current of $i_O=i_{L2}$. In one non-limiting example, whenever $i_O<i_{L2}$, the DC power supply 902 may boost or raise its output voltage until $i_O=i_{L2}$. Although not necessary, in some examples, the DC power supply 902 may be used in conjunction with a voltage multiplier (e.g., shown as voltage multiplier 724 in FIG. 7).

In some examples, a controllable switch (e.g., a single quadrant switch, two quadrant switch, etc., further described in relation to FIGS. 16-20) may be used in place of a diode for the first switch S1. For instance, in some circumstances, the condition $i_O=i_{L2}$ may be satisfied, but operating needs may require that the voltage across the switching circuit 1204 be equal to the voltage at N4. In such cases, a diode (i.e., as first switch S1) may be replaced by a controllable switch that can be turned ON regardless of $i_O$.

In one embodiment, the first and second rails 950 and 952 are floating, such that neither is referenced to ground. The second rail 952, can be referred to as a low-level connection.

The switching circuit 904 takes either DC voltage or constant power from the DC power supply 902 and generates pulsed DC power. The switching circuit 904 is shown as a full H-bridge, though two or more full or half bridges can be used to increase power handling.

The plasma load 906 can be part of a plasma processing chamber, such as those used in plasma sputtering. Power can be provided to the plasma load 906 via one or more electrodes such as those in single- and dual-magnetron sputtering.

The DC power supply 902, 1002 can be embodied by a voltage source or other voltage-regulating power supply. In one embodiment, the DC power supply 902, 1002 can be any power supply having an output voltage that is limited to slow changes in current. For instance, the DC power supply 902, 1002 can be any power supply having a capacitive output behavior.

The inductive elements noted throughout this disclosure can be embodied by a single element, such as an inductor, or a group of inductive elements, such a series or parallel arrangement of two or more inductors.

The capacitive elements noted throughout this disclosure can be embodied by a single element, such as a capacitor, or a group of capacitive elements, such a series or parallel arrangement of two or more capacitors.

FIG. 12 illustrates various capacitances and currents based on switching of the snubber and switching circuit. In these illustrations, it is assumed that the first switch, S1, is a diode. FIG. 12A shows the timing of the second switch, S2, while FIG. 12B shows the timing of the third switch, S3. FIGS. 12E and 12F show timing of the switch pairs in the switching circuit, and one can see that the frequency of the switching circuit (S4, S5, S6, S7) is greater than that of the switches in the snubber (S2, S3). The duty cycle of the second and third switches, S2 and S3 controls an average DC voltage, $V_C$, across the capacitive element, C, as well as a second current, $i_{L2}$, through the second inductive element, L2. The average DC voltage, Vc, is selected to achieve a desired boost voltage between nodes N1 and N5. However, one can also see that the higher frequency of the switching circuit influences an instantaneous voltage, $V_C$, across the capacitive element, C. Similarly, while a first current, $i_{L1}$, through the first inductive element, $L_1$, is relatively constant, there is some variation corresponding to the switching frequency of the switching circuit. The output voltage, $v_O$, and the output current, $i_O$, both measured between the switching circuit and the plasma load, are pulsing in phase with the switching circuit.

Looking back at FIGS. 9, 10, and 11, one advantage of the snubbers 900 and 1000 is their ability to non-dissipatively absorb energy from the DC power supply 902, 1002 when an impedance of the load 906, 1006 increases, or substantially increases. For instance, where the load 906, 1006 is a plasma, and the plasma dims or is extinguished, the plasma impedance increases substantially. When the load 906, 1006 impedance increases substantially, the DC power supply 902, 1002 continues to deliver the same power, and this power would dissipate largely in the switching circuit 904, 1004. However, the snubber 900, 1000, and in particular, the capacitive element C, absorbs a large portion of this energy, thus protecting the switching circuit 904, 1004.

A third advantage of the snubbers 900, 1000 is an ability to boost a voltage that the DC power supply 902, 1002 provides to the load 906, 1006, and consequently boost a current ramp rate provided to the load 906, 1006. When the capacitive element C absorbs energy from the DC power supply 902, 1002, a voltage between the rails 950, 952 or 1050, 1052 (or a voltage between nodes N4 and N5), is raised to a value higher than the one generated by the DC power supply 902, 1002. In this way, the capacitive element C can boost a voltage, and thus a current ramp rate, provided to the load 906, 1006 after the load 906, 1006 impedance rises (e.g., a boost voltage, $V_2$).

Figure 13:
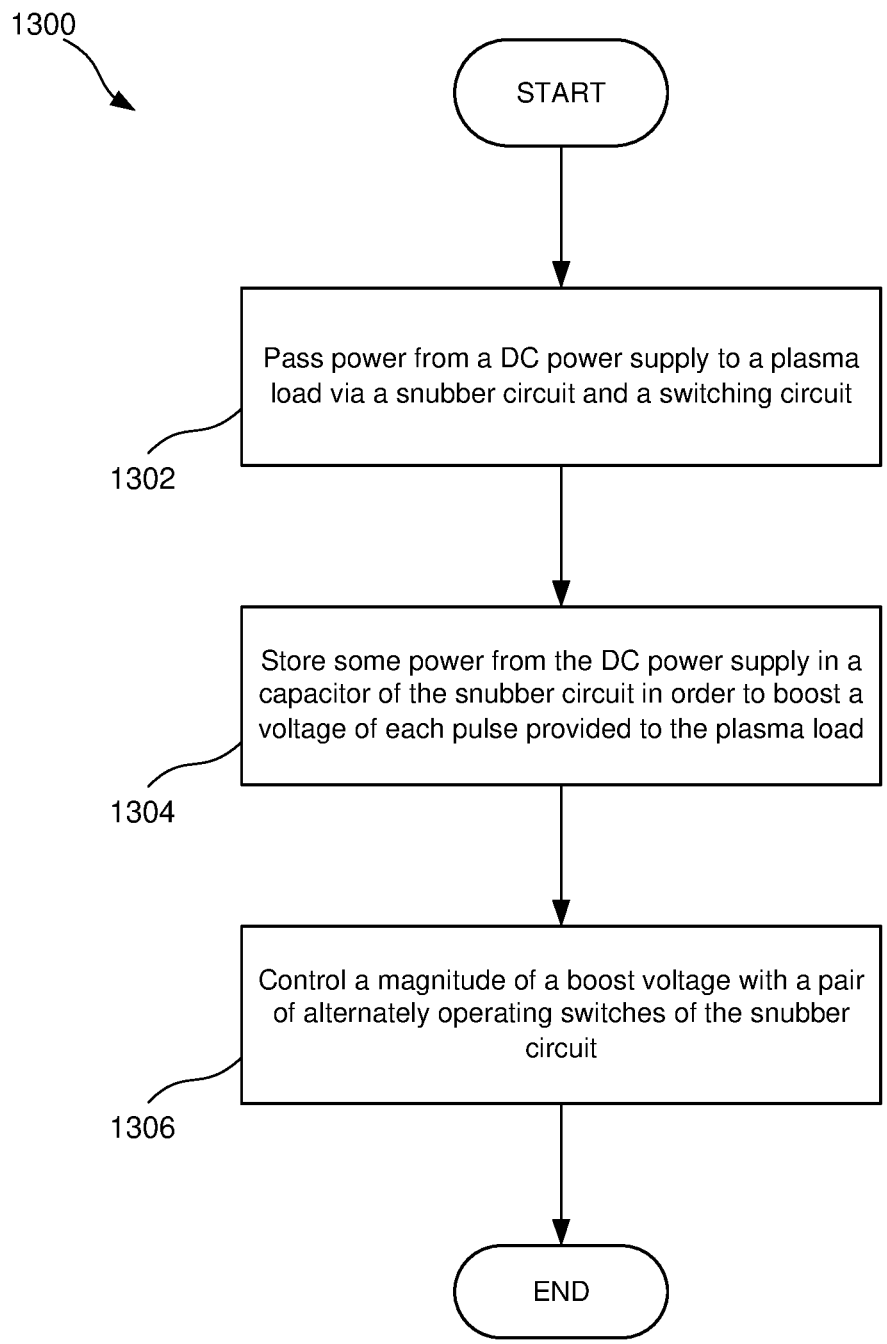
FIG. 13 illustrates a method of controlling a snubber/voltage-boosting circuit.

FIG. 13 illustrates a method of controlling power through the snubber. The method 1300 can include passing power from a DC power supply (e.g., 902) to a plasma load (e.g., 906) via a snubber circuit (e.g., 900) and a switching circuit (e.g., 904) (Block 1302). The method 1300 also includes storing some power from the DC power supply in a capacitor of the snubber circuit in order to boost a voltage of each pulse provided to the plasma load (Block 1306). The method 1300 also includes controlling a magnitude of a boost voltage with a pair of alternately operating switches of the snubber circuit (Block 1306). In other words, adjusting a duty cycle of these two switches (e.g., S2 and S3) controls a voltage passed to the switching circuit and hence provided to the plasma load.

Figure 14:
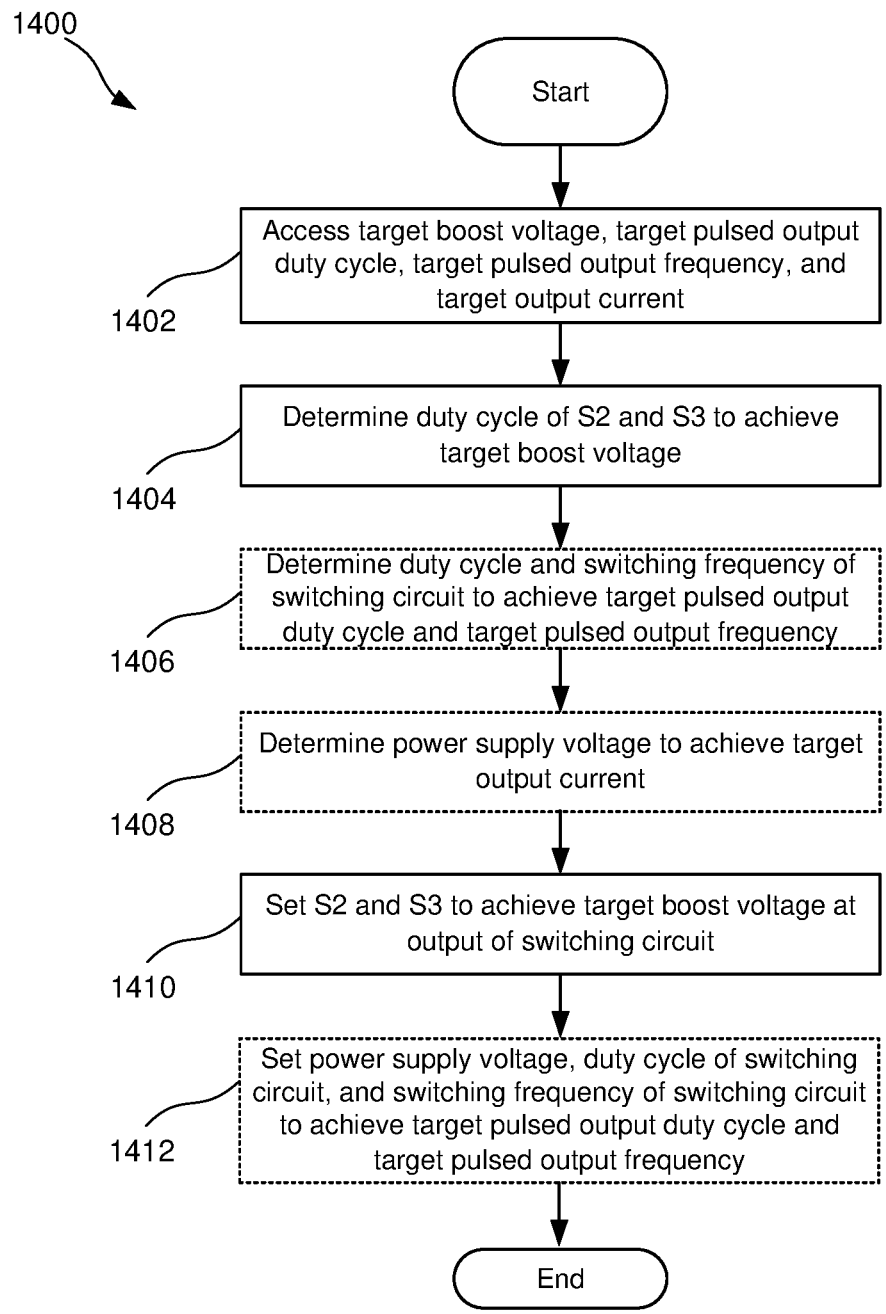
FIG. 14 illustrates another method of controlling a snubber/voltage-boosting circuit.

FIG. 14 illustrates another method of controlling power through the snubber. As an initial matter, the method 1400 can include providing a snubber circuit coupled to a switching circuit, the snubber circuit configured to be coupled between a DC power supply and the switching circuit, and the switching circuit configured to be coupled between the snubber circuit and the plasma processing chamber. The snubber circuit can comprise two switches whose duty cycle is configured to control a voltage across a capacitor of the snubber and thereby to regulate a DC voltage provided at an output of the switching circuit to the plasma processing chamber. The method 1400 includes accessing a target boost voltage, a target pulsed output duty cycle, a target pulsed output frequency, and a target output current (Block 1402). The method 1400 then determines a duty cycle of a second switch, S2, and a third switch, S3, to achieve the target boost voltage (Block 1404). For instance, a controller could access the target boost voltage and convert that target to a duty cycle for the second and third switches, S2 and S3, and then send control signals to the second and third switches, S2 and S3, to affect the target boost voltage. The method 1400 can optionally determine a duty cycle and switching frequency of the switching circuit to achieve the target pulsed output duty cycle and the target output frequency (optional Block 1406). The method 1400 can also optionally determine a power supply voltage needed to achieve the target output current (optional Block 1408). The method 1400 can also set (e.g., control with a duty cycle) the second and third switches, S2 and S3, to achieve a target boost voltage at the output of the switching circuit (Block 1410). The method 1400 can further optionally set the power supply voltage, the duty cycle of the switching circuit, and the switching frequency of the switching circuit to achieve the target pulsed output duty cycle and the target pulsed output frequency (optional Block 1412).

Although this disclosure has focused on embodiments where snubbers are used to mitigate voltage and current spikes (or ramps) in a power supply system, and in particular for pulsed DC applications, it is envisioned that the disclosed snubber can be used in a variety of other voltage and/or current clamping situations.

FIGS. 16-20 discuss generalized descriptions of switches in terms of their electrical operations. Switches are commonly used in numerous electrical and electronics applications. In some cases, electrical switches are nonlinear devices, and can be modeled as two or three-terminal devices. Two terminal switches (e.g., shown as switch 1600 in FIG. 16A) comprise an input terminal 1622 and an output terminal 1624, while three terminal switches include a control terminal in addition to the input and output terminals. In some cases, the input and output terminals of a switch exhibit symmetric properties. For instance, when the control terminal has a TRUE or a logical 1 signal on it, the input is connected to the output through a short circuit, and the switch is said to be in its ON state. Contrastingly, when there is an open circuit between the input and output terminals, the switch is said to be in an OFF state. In some cases, v-i curves at the input-output terminal pairs may be plotted, where the y axis relates to the current flow (i) through the switch when it is in the ON state, while the x axis relates to the voltage (v) blocked by the switch when it is in the OFF state. The effect of the control terminal can be considered by plotting a different v-i curve for each value at the control terminal. In one simple example, when the control input is a logical 0, the v-i curve for the input-output terminal pair indicates that the current through the switch is 0, irrespective of the voltage applied. Conversely, the switch behaves like a short circuit between its input and output terminals when the control input is a logical 1. When behaving like a short circuit, the voltage across the input and output terminals may be zero, and the current may be unconstrained by the switch (i.e., the current may be affected by constraints external to the switch).

In some cases, a switch (e.g., transistor, diode) may be referred to as active or passive, depending on if it comprises a control terminal (i.e., in addition to the input and output terminals). For instance, active switches refer to switches that comprise a third control terminal, where a control signal may be applied. Conversely, a passive switch may not contain a control terminal, and the state of the switch may be determined by the current (i(t)) and voltage (v(t)) waveforms applied to the input and/or output terminals. Some non-limiting examples of active switches include Bipolar Junction Transistors (BJTs), Metal-Oxide Semiconductor Field Effect Transistors (MOSFETs), Insulated Gate Bipolar Transistors (IGBTs), Gate turn-off Thyristors (GTOs), and MOS-Controlled Thyristors (MCTs). One non-limiting example of a passive switch includes a diode. In some cases, a switching circuit (also referred to as a switch) may be realized using one or more of transistors and diodes. Generally, a switch may be realized using semiconductor devices based on the polarity of the voltage (v) that the device blocks in the off state, and the polarity of the current (i) that the device conducts in the on state.

Figure 16A:
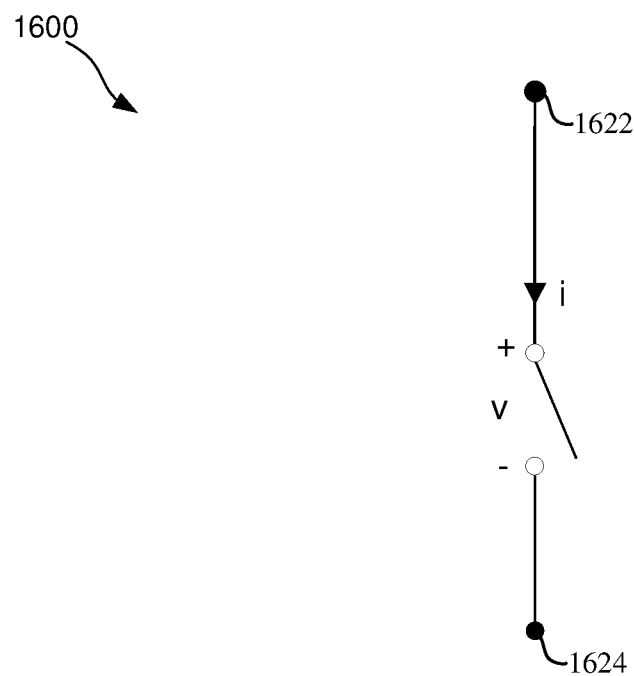
FIG. 16A illustrates an exemplary switch.
Figure 16B:
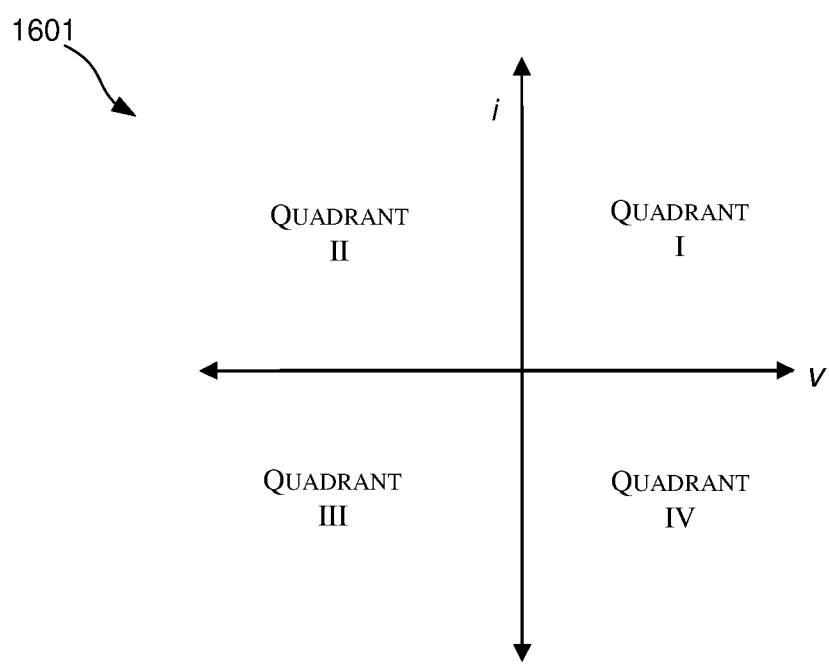
FIG. 16B illustrates four quadrants of an i-v curve used to describe different switches.

In some examples, switches may be classified based on the regions or quadrants of the v-i plane in which they operate. For instance, FIG. 16B illustrates the four quadrants of a v-i graph 1601. In some cases, a switch may be classified as a single-quadrant switch based on its v-i curves existing in a single quadrant, such as the top-right quadrant (also referred to as quadrant-I, where both v and i only have positive values) or top-left quadrant (i.e., quadrant II, where the switch conducts positive current, i, and blocks negative voltages, v). Two quadrant switches can be quadrant I and IV or I and II. For instance, a current-bidirectional two-quadrant switch has v-i curves existing in the top-right quadrant (or quadrant I) and bottom right quadrant (or quadrant IV). Further, a voltage-bidirectional two-quadrant switch has v-i curves existing in the top-right quadrant (or quadrant I) and top-left quadrant (or quadrant II). Lastly, a four-quadrant switch refers to a switch whose v-i curves exist in any of the four quadrants. In other words, a four-quadrant switch may be capable of conducting currents of either positive or negative polarity and blocking voltages of either positive or negative polarity.

Figure 17A:
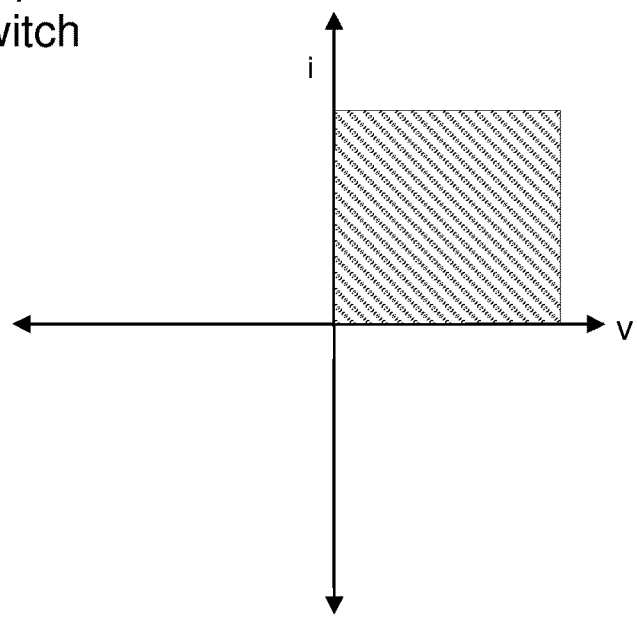
FIG. 17A illustrates quadrant I.
Figure 17B:
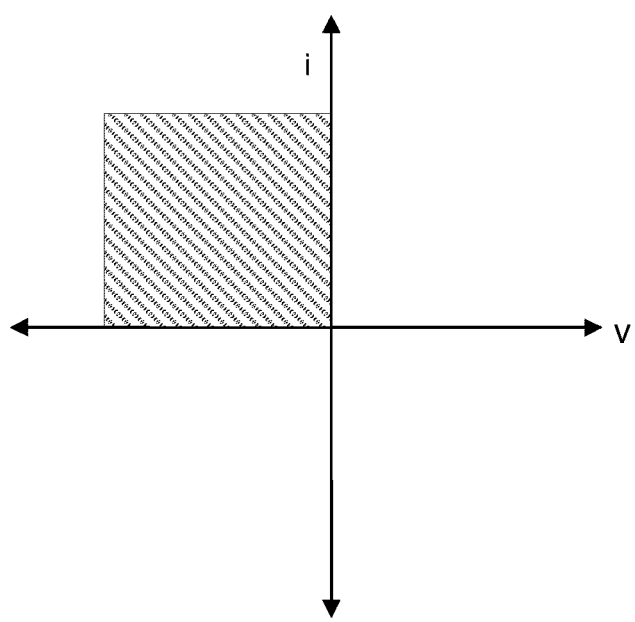
FIG. 17B illustrates quadrant II.
Figure 17C:
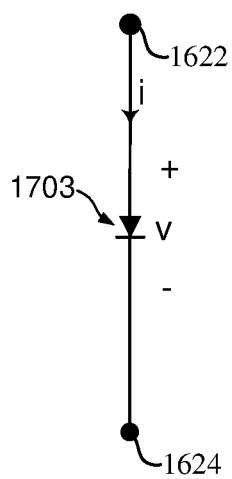
FIG. 17C illustrates a switch in the form of a diode.
Figure 17D:
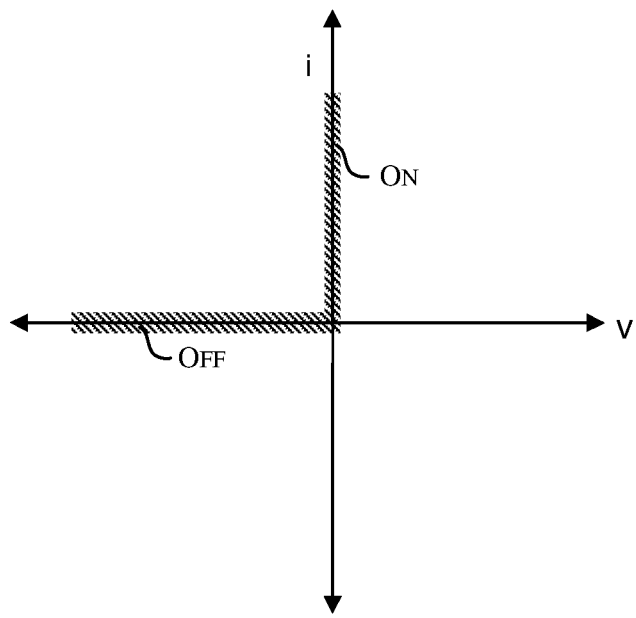
FIG. 17D illustrates the quadrant II representation of the diode of FIG. 17C.
Figure 17E:
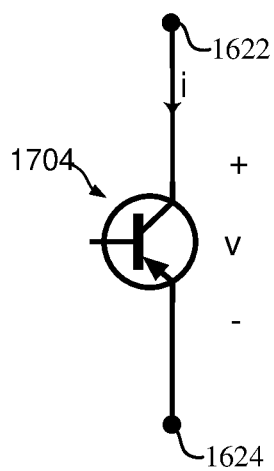
FIG. 17E illustrates a switch in the form of a BJT.
Figure 17F:
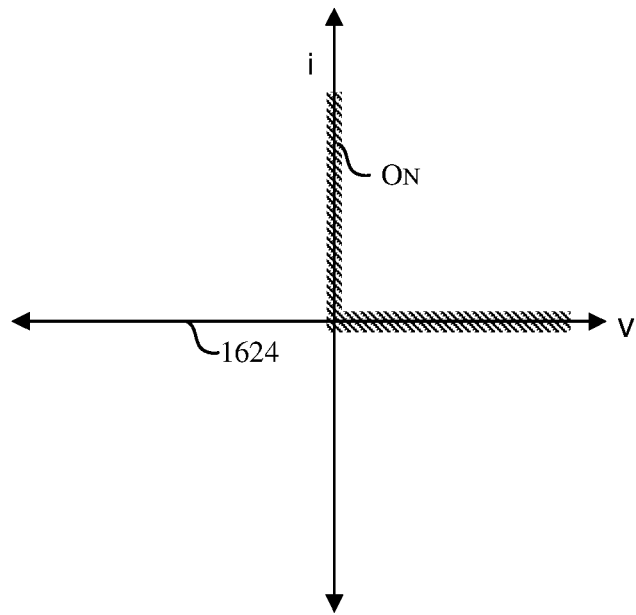
FIG. 17F illustrates the quadrant I representation of the BJT of FIG. 17E.
Figure 17G:
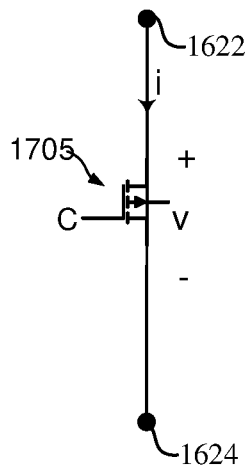
FIG. 17G illustrates a switch in the form of MOSFET.
Figure 17H:
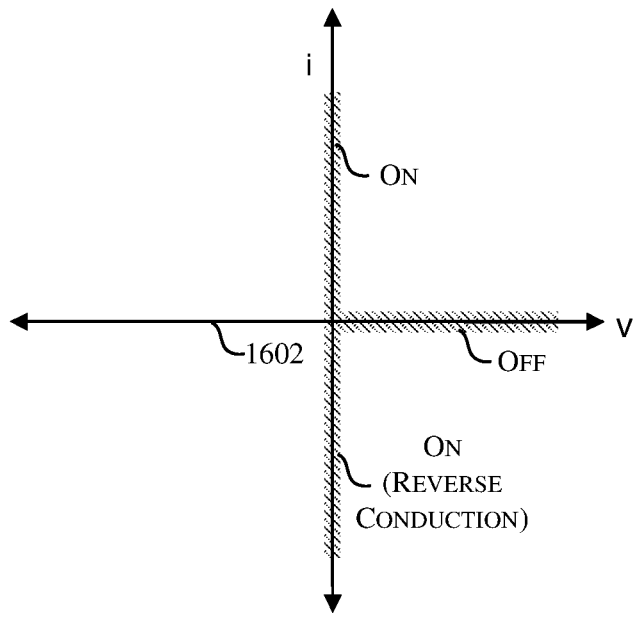
FIG. 17H illustrates the quadrant I and IV representation of the MOSFET of FIG. 17G.
Figure 17I:
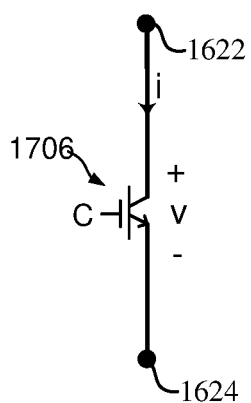
FIG. 17I illustrates a switch in the form of an IGBT.
Figure 17J:
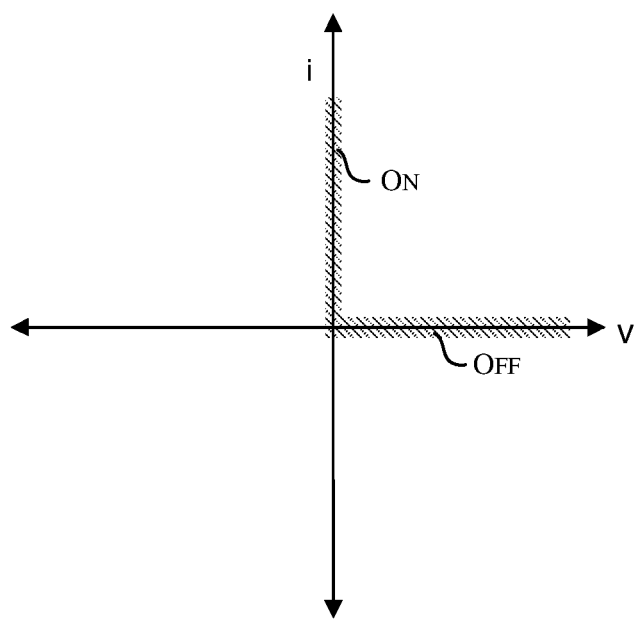
FIG. 17J illustrates the quadrant I representation of the BJT.

In some cases, semiconductor power devices, such as transistors and/or diodes, behave as single-pole single-throw (SPST) switches (i.e., a switch that has a single input and connects to a single output). A SPST switch serves as an on-off switch in a circuit (i.e., when the switch is closed or on, current flows through the switch; when the switch is open or off, current does not flow through the switch). Other switch topologies, such as single pole double throw (SPDT), double pole double throw (DPDT), and double pole single throw (DPST) are contemplated in different embodiments. In some cases, a single-quadrant SPST switch may be capable of conducting currents of a single polarity (e.g., positive currents), and of blocking voltages of a single polarity (e.g., negative voltages). Use of single-quadrant switches is common in DC-DC converters. In some non-limiting examples, a single-quadrant SPST switch may be implemented using a BJT or IGBT. Furthermore, while MOSFETs or power MOSFETs share similar characteristics with the BJT and IGBT, namely that they are capable of blocking positive voltages (i.e., v>0) in the off state, and conducting positive current (i.e., i>0) in the on state, they are also able to conduct current in the reverse direction (i.e., i<0). While not necessary, MOSFETs are normally operated with i>0, similar to the BJT and IGBT. Thus, in some cases, an active SPST switch may be realized using any of a BJT, IGBT, or MOSFET, to name three non-limiting examples. FIGS. 17A and 17B illustrate two example regions of a v-i curve in which a single quadrant switch may operate. Further, FIGS. 17C and 17E illustrate two example devices that may be used to implement a single quadrant switch, where FIG. 17C illustrates a diode 1703 and FIG. 17E illustrates a BJT. Further, FIGS. 17D and 17F depict the polarity of the current that may be conducted and polarity of voltage that may be blocked by the devices of FIGS. 17C and 17E, respectively, when they are in an ON state and OFF state. FIG. 17G illustrates a MOSFET 1705 that may be used to implement a dual-quadrant switch, while FIG. 17I illustrates an IGBT 1706, with single quadrant operation. FIGS. 17H and 17J depict the polarity of the current that may be conducted and polarity of voltage that may be blocked by the devices of FIGS. 17H and 17J, respectively, when they are in an ON state and OFF state.

Figure 18A:
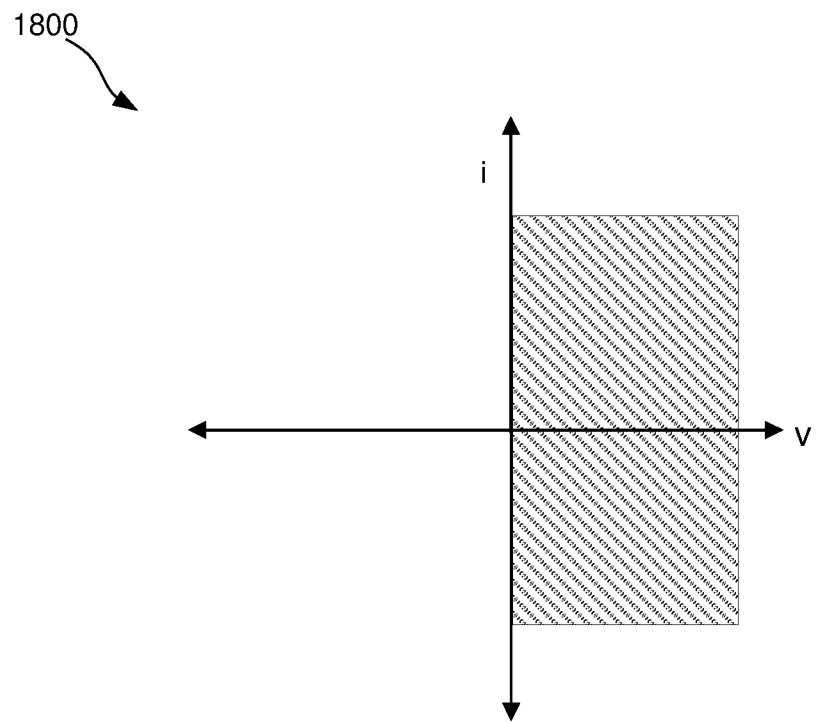
FIG. 18A illustrates the quadrant I and IV representation of a current bi-directional two quadrant switch.
Figure 18B:
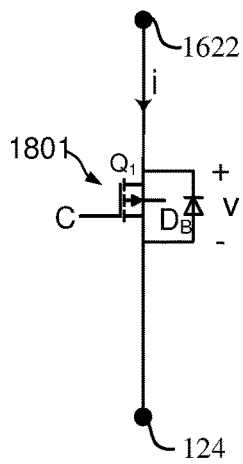
FIG. 18B illustrates an SPST switch 1801 in the form of a MOSFET and its body diode connected in an anti-parallel manner.
Figure 18C:
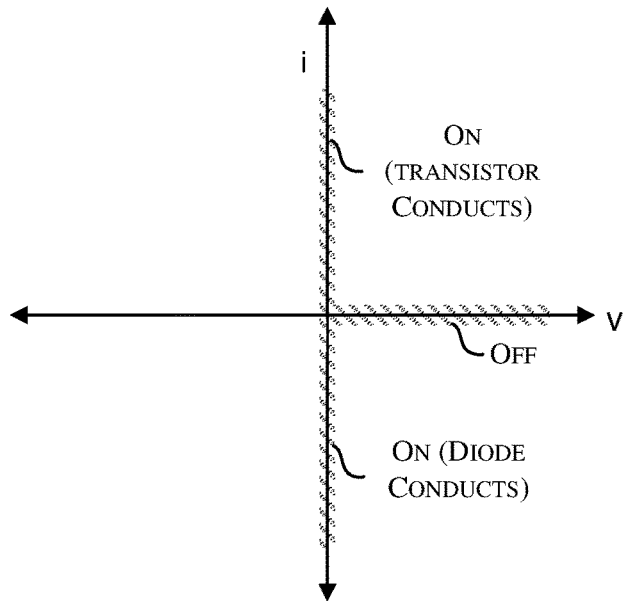
FIG. 18C illustrates the quadrant I and IV representation of the SPST of FIG. 18B.
Figure 18D:
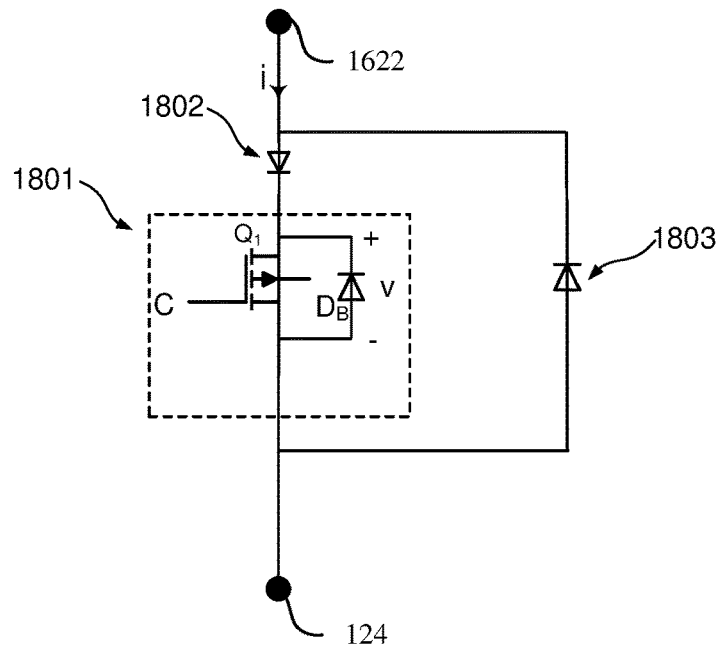
FIG. 18D illustrates a switch in the form of a current-bidirectional two-quadrant SPST switch realized by a MOSFET and diode arranged in an anti-parallel topology.

In some applications, such as DC-AC inverters, a switching circuit capable of conducting current of both polarities (i.e., positive or negative on-state current) and blocking positive voltages may be utilized. For example, in inverter circuits, the output current may be AC. That is, the output current switches between positive and negative polarity. In such cases, a two-quadrant SPST switch may be realized, for instance, using a transistor and a diode. FIG. 18A illustrates an example region of a v-i curve 1800 in which a current bi-directional two quadrant switch may operate. Alternatively, in an inverter circuit, the output current may be positive, while the blocking voltage may be AC. In such cases, the two-quadrant switch may be constructed using a different arrangement of a transistor and diode. In some examples, a current-bidirectional two-quadrant SPST switch 1801 may be realized using a transistor 1801 (e.g., MOSFET Q1) and diode 1803 connected in an anti-parallel manner, as seen in FIG. 18D. Further, the transistor 1801 may be controlled using the terminal C. As noted above, MOSFETs may operate as two-quadrant switches (i.e., since they are capable of conducting current in the reverse direction). In some cases, power MOSFETs inherently comprise a built-in diode, also referred to as a body-diode (DB). However, the switching speed of the MOSFET (Q1) is usually significantly faster than that of the body diode (DB). This difference in switching speed may cause high-peak currents to flow through the MOSFET (Q1) during the diode turn-off transition, which may adversely impact MOSFET performance, or even lead to device failure. To mitigate against this risk, one or more external series and antiparallel diodes 1802, 1803 may be added, as seen in FIG. 18D.

Figure 19A:
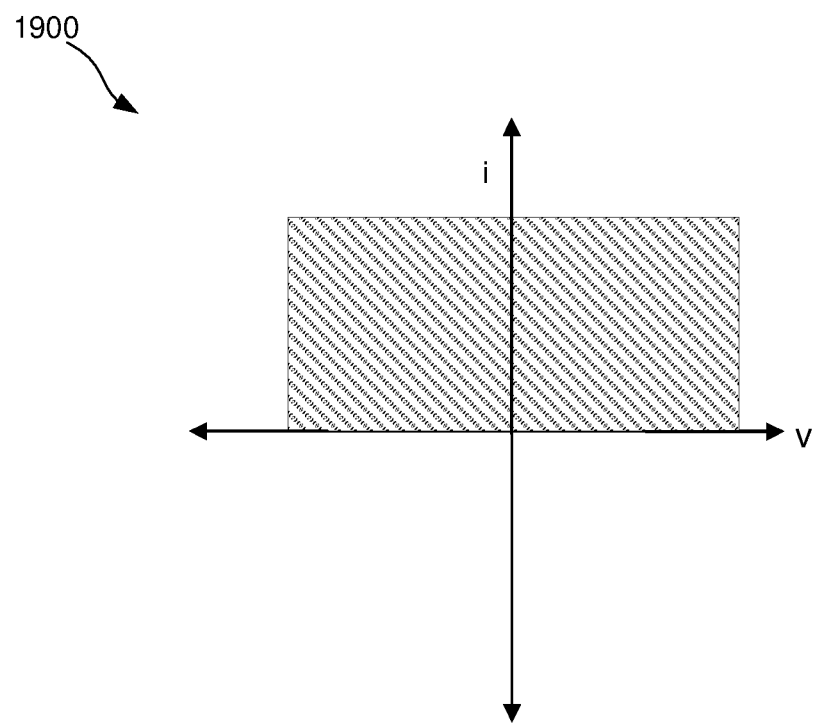
FIG. 19A illustrates the quadrant I and II representation of a voltage bi-directional two quadrant switch.
Figure 19B:
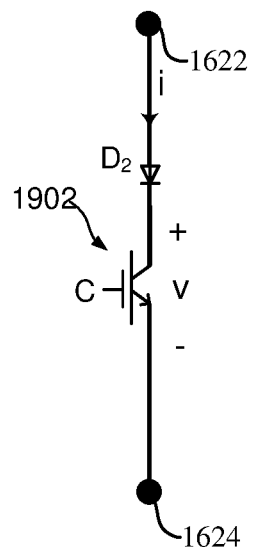
FIG. 19B illustrates a switch in the form of a BJT in series with a diode.
Figure 19C:
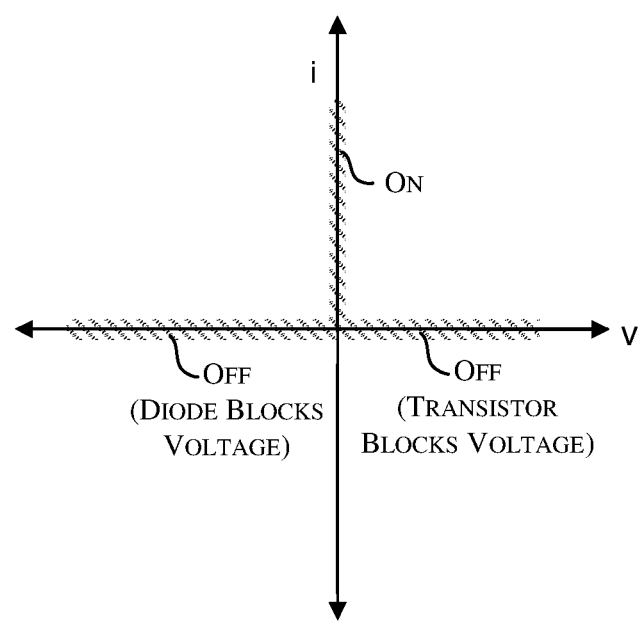
FIG. 19C illustrates the quadrant I and II representation of the BJT in series with a diode of FIG. 19B.

Another example of a two-quadrant switch may comprise a voltage bidirectional two-quadrant switch. FIG. 19A shows an example region of a v-i graph 1900 in which a voltage bidirectional two-quadrant switch may operate. In some cases, these switches are designed to block both positive and negative voltages, while enabling the flow of positive current. An SPST switch having such properties may be constructed using a series-connected transistor 1902 and diode D2, as shown in FIG. 19B. In this example, when the switch is in the off state (i.e., when the controller turns the transistor off), the diode may block negative voltage, while the transistor blocks positive voltage, as shown in FIG. 19C. Further, the series arrangement of the diode and transistor may allow blocking of negative voltages up to a first threshold (e.g., the diode voltage rating), and positive voltages up to a second threshold (e.g., the transistor voltage rating). It should be noted that the first and second thresholds may be the same or different. As illustrated in FIG. 19C, a voltage-bidirectional two-quadrant switch may conduct positive current in the ON state. In some cases, the transistor 1902 in FIG. 19B may be controlled by the terminal C. In some other cases, a controlled rectifier (e.g., a silicon controlled rectifier (SCR)) may be used to realize a voltage bidirectional two-quadrant switch.

Figure 20A:
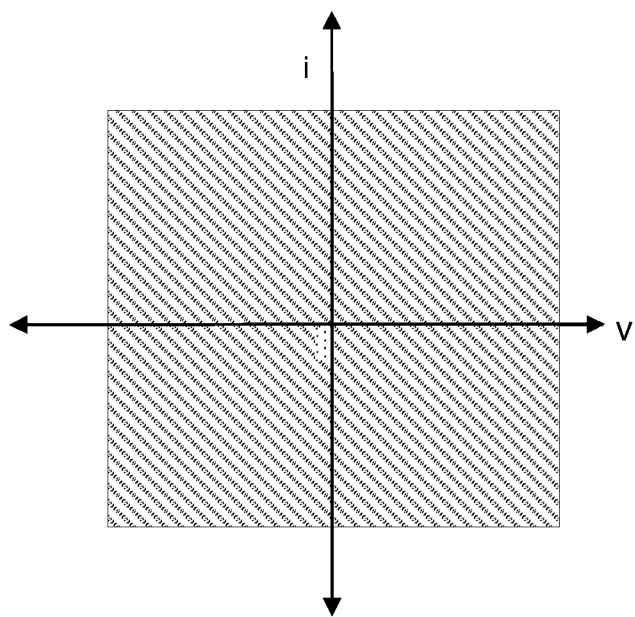
FIG. 20A illustrates the quadrant I, II, III, and IV representation of a four quadrant switch.

In some cases, four-quadrant switches may be configured to conduct either polarity of current and/or block polarity of voltage, as shown in FIG. 20A. In some cases, four-quadrant switches may be realized by connecting two current-bidirectional switches back-to-back, as shown in FIG. 20B. In such cases, the transistors may be driven on and off simultaneously. In another example, two voltage-bidirectional two-quadrant switches may be connected in an anti-parallel manner, as shown in FIG. 20C. In yet another example, a transistor (e.g., BJT) may be coupled across two opposing terminals of a bridge rectifier (or diode bridge), as shown in FIG. 20D.

It should be noted that, the examples described above are not intended to be limiting, and different components and/or topologies for realizing single, double, and/or four quadrant switches are contemplated in other embodiments.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Figure 15:
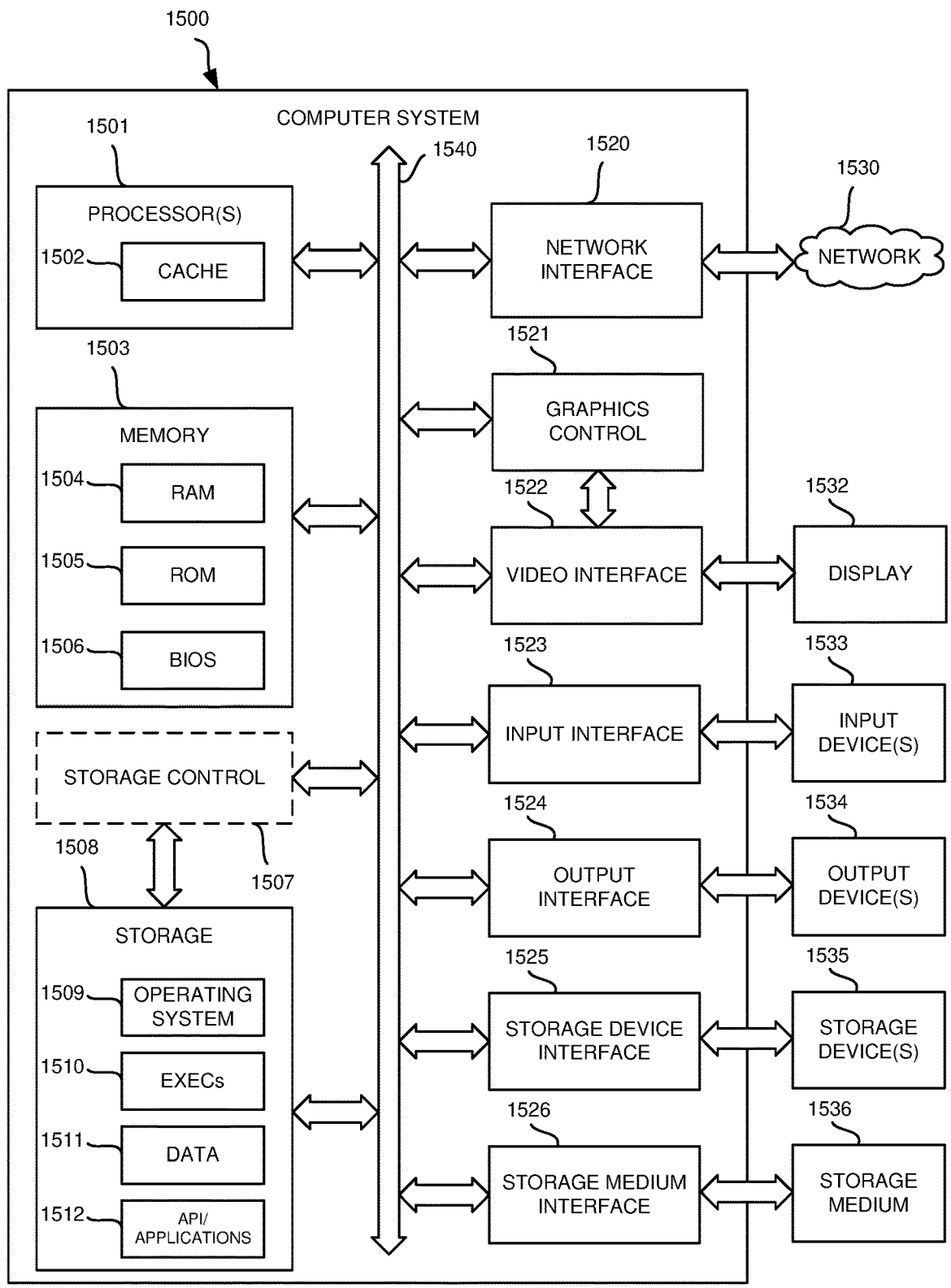
FIG. 15 shows a diagrammatic representation of one embodiment of a machine in the exemplary form of a computer system 1500 within which a set of instructions can execute for causing a device to perform or execute any one or more of the aspects and/or methodologies of the present disclosure.

The systems and methods described herein can be implemented in a machine such as a computer system in addition to the specific physical devices described herein. FIG. 15 shows a diagrammatic representation of one embodiment of a machine in the exemplary form of a computer system 1500 within which a set of instructions can execute for causing a device to perform or execute any one or more of the aspects and/or methodologies of the present disclosure. The components in FIG. 15 are examples only and do not limit the scope of use or functionality of any hardware, software, embedded logic component, or a combination of two or more such components implementing particular embodiments.

Computer system 1500 may include a processor 1501, a memory 1503, and a storage 1508 that communicate with each other, and with other components, via a bus 1540. The bus 1540 may also link a display 1532, one or more input devices 1533 (which may, for example, include a keypad, a keyboard, a mouse, a stylus, etc.), one or more output devices 1534, one or more storage devices 1535, and various tangible storage media 1536. All of these elements may interface directly or via one or more interfaces or adaptors to the bus 1540. For instance, the various tangible storage media 1536 can interface with the bus 1540 via storage medium interface 1526. Computer system 1500 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 1501 (or central processing unit(s) (CPU(s))) optionally contains a cache memory unit 1502 for temporary local storage of instructions, data, or computer addresses. Processor(s) 1501 are configured to assist in execution of computer readable instructions. Computer system 1500 may provide functionality as a result of the processor(s) 1501 executing software embodied in one or more tangible computer-readable storage media, such as memory 1503, storage 1508, storage devices 1535, and/or storage medium 1536. The computer-readable media may store software that implements particular embodiments, and processor(s) 1501 may execute the software. Memory 1503 may read the software from one or more other computer-readable media (such as mass storage device(s) 1535, 1536) or from one or more other sources through a suitable interface, such as network interface 1520. The software may cause processor(s) 1501 to carry out one or more processes or one or more steps of one or more processes described or illustrated herein. Carrying out such processes or steps may include defining data structures stored in memory 1503 and modifying the data structures as directed by the software.

The memory 1503 may include various components (e.g., machine readable media) including, but not limited to, a random access memory component (e.g., RAM 1504) (e.g., a static RAM "SRAM", a dynamic RAM "DRAM, etc.), a read-only component (e.g., ROM 1505), and any combinations thereof. ROM 1505 may act to communicate data and instructions unidirectionally to processor(s) 1501, and RAM 1504 may act to communicate data and instructions bidirectionally with processor(s) 1501. ROM 1505 and RAM 1504 may include any suitable tangible computer-readable media described below. In one example, a basic input/output system 1506 (BIOS), including basic routines that help to transfer information between elements within computer system 1500, such as during start-up, may be stored in the memory 1503.

Fixed storage 1508 is connected bidirectionally to processor(s) 1501, optionally through storage control unit 1507. Fixed storage 1508 provides additional data storage capacity and may also include any suitable tangible computer-readable media described herein. Storage 1508 may be used to store operating system 1509, EXECs 1510 (executables), data 1511, API applications 1512 (application programs), and the like. Often, although not always, storage 1508 is a secondary storage medium (such as a hard disk) that is slower than primary storage (e.g., memory 1503). Storage 1508 can also include an optical disk drive, a solid-state memory device (e.g., flash-based systems), or a combination of any of the above. Information in storage 1508 may, in appropriate cases, be incorporated as virtual memory in memory 1503.

In one example, storage device(s) 1535 may be removably interfaced with computer system 1500 (e.g., via an external port connector (not shown)) via a storage device interface 1525. Particularly, storage device(s) 1535 and an associated machine-readable medium may provide nonvolatile and/or volatile storage of machine-readable instructions, data structures, program modules, and/or other data for the computer system 1500. In one example, software may reside, completely or partially, within a machine-readable medium on storage device(s) 1535. In another example, software may reside, completely or partially, within processor(s) 1501.

Bus 1540 connects a wide variety of subsystems. Herein, reference to a bus may encompass one or more digital signal lines serving a common function, where appropriate. Bus 1540 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 1500 may also include an input device 1533. In one example, a user of computer system 1500 may enter commands and/or other information into computer system 1500 via input device(s) 1533. Examples of an input device(s) 1533 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 1533 may be interfaced to bus 1540 via any of a variety of input interfaces 1523 (e.g., input interface 1523) including, but not limited to, serial, parallel, game port, USB, FIREWIRE, THUNDERBOLT, or any combination of the above.

In particular embodiments, when computer system 1500 is connected to network 1530, computer system 1500 may communicate with other devices, specifically mobile devices and enterprise systems, connected to network 1530. Communications to and from computer system 1500 may be sent through network interface 1520. For example, network interface 1520 may receive incoming communications (such as requests or responses from other devices) in the form of one or more packets (such as Internet Protocol (IP) packets) from network 1530, and computer system 1500 may store the incoming communications in memory 1503 for processing. Computer system 1500 may similarly store outgoing communications (such as requests or responses to other devices) in the form of one or more packets in memory 1503 and communicated to network 1530 from network interface 1520. Processor(s) 1501 may access these communication packets stored in memory 1503 for processing.

Examples of the network interface 1520 include, but are not limited to, a network interface card, a modem, and any combination thereof. Examples of a network 1530 or network segment 1530 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 1530, may employ a wired and/or a wireless mode of communication. In general, any network topology may be used.

Information and data can be displayed through a display 1532. Examples of a display 1532 include, but are not limited to, a liquid crystal display (LCD), an organic liquid crystal display (OLED), a cathode ray tube (CRT), a plasma display, and any combinations thereof. The display 1532 can interface to the processor(s) 1501, memory 1503, and fixed storage 1508, as well as other devices, such as input device(s) 1533, via the bus 1540. The display 1532 is linked to the bus 1540 via a video interface 1522, and transport of data between the display 1532 and the bus 1540 can be controlled via the graphics control 1521.

In addition to a display 1532, computer system 1500 may include one or more other peripheral output devices 1534 including, but not limited to, an audio speaker, a printer, and any combinations thereof. Such peripheral output devices may be connected to the bus 1540 via an output interface 1524. Examples of an output interface 1524 include, but are not limited to, a serial port, a parallel connection, a USB port, a FIREWIRE port, a THUNDERBOLT port, and any combinations thereof.

In addition or as an alternative, computer system 1500 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a computer-readable medium may encompass a circuit (such as an IC) storing software for execution, a circuit embodying logic for execution, or both, where appropriate. The present disclosure encompasses any suitable combination of hardware, software, or both.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

One of skill in the art will recognize that the plots of voltage and current (e.g., FIGS. 2A, 2B, 8A, 8B, 11, and 13) are not necessarily drawn to scale, and that the shape and scale of different features of the waveforms can change depending on the circuits used to generate these waveforms. For instance, the pulse width of the voltage increase at the start of each pulse may vary depending on the power passing to the snubber and depending on capacitance value within the snubber (e.g., the capacitance of the capacitive element, C, in FIGS. 9 and 10). As another example, vertical aspects of the voltage pulses illustrated in FIGS. 8A and 8B may have finite slopes in practice. For instance, the falling edge of the boosted voltage (the first portion of each pulse) can have a negative slope that is a function of inductance and capacitance. The front vertical aspect of each pulse can in practice include an exponentially increasing portion for boost voltage, $V_2$, where the boosted voltage, $V_1+V_2$ rises above the process voltage, $V_1$, as a function of charge accumulation on the capacitive element, C, in FIGS. 9 and 10. These examples demonstrate that the plots of voltage and current in the figures are meant as illustrations and generalizations only, and that variations on these specific waveforms can be made without departing from the scope of this disclosure.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit comprising:
   a first node for a first DC power connection;
   an output;
   a second DC power connection;
   a first inductive element coupled between the first node and a second node;
   a second inductive element coupled between the first node and a third node, the third node coupled to the output;
   a capacitive element coupled between the first node and a fourth node;
   a first switch coupled between the third and fourth nodes;
   a second switch coupled between the second and fourth nodes; and a third switch coupled between the second node and the second DC power connection.

2. The circuit of claim 1, wherein either or both of the first and second inductive elements comprise one inductor or a group of inductors connected in series and/or in parallel.

3. The circuit of claim 1, wherein the capacitive element comprises one capacitor or a group of capacitors connected in series and/or parallel.

4. The circuit of claim 1, wherein the second connection is tied to a low-level connection of a DC power supply.

5. The circuit of claim 1, wherein the first switch is a dual-quadrant switch.

6. The circuit of claim 5, wherein the first switch is a quadrant 1 and 3 switch.

7. The circuit of claim 6, wherein a negative terminal of the first switch is coupled to the third node.

8. The circuit of claim 1, wherein the second and third switches are single quadrant switches.

9. The circuit of claim 1, wherein a voltage across the capacitive element is controlled by varying a duty cycle of the first switch.

10. A power supply system comprising:
a DC power supply configured to provide a process voltage, $V_1$, to a first and a second rail;
a first switching circuit coupled to the first and second rails, and configured to convert the process voltage, $V_1$, and any other voltage on the first and second rails, to a pulsed output;
a voltage-boosting circuit coupled between the first and second rails and comprising:
a capacitive element;
two inductive elements; and
three switches, wherein
the two inductive elements and the capacitive element are connected at a first node, and wherein
the voltage-boosting circuit is configured to draw current from the DC power supply to raise a voltage between the first and second rail by a boost voltage, $V_2$, where the boost voltage, $V_2$, is selectable by a duty cycle of two of the three switches.

11. The power supply system of claim 10, wherein the two of the three switches are single quadrant switches.

12. The power supply system of claim 11, wherein a third of the three switches is a two-quadrant switch.

13. The power supply system of claim 12, wherein the third of the three switches is a diode.

14. The power supply system of claim 11, wherein a voltage across the capacitive element is controlled by a duty cycle of a first of the three switches.

15. The power supply system of claim 10, wherein the two of the three switches are coupled to a first of the two inductive elements at a second node.

16. The power supply system of claim 15, wherein a third of the three switches is coupled to a second of the two inductive elements at a third node.

17. The power supply system of claim 16, wherein the third of the three switches and the capacitive element are coupled at a fourth node.

18. A method of providing power, the method comprising:
providing a circuit to couple between a power supply and a switching circuit, the circuit comprising at least two switches whose duty cycle is configured to control a voltage across a capacitor of the circuit and thereby regulate a DC voltage provided at an output of the switching circuit;
accessing, for the switching circuit, a target boost voltage; and
setting a duty cycle of the at least two switches to achieve the target boost voltage at the output of the switching circuit.

19. The method of claim 18, further comprising:
accessing a target output current for the switching circuit; and
setting an output voltage of the power supply to achieve the target output current at the output of the switching circuit.

20. The method of claim 19, further comprising: accessing a target pulsed output duty cycle and a target pulsed output frequency for the switching circuit; and setting a duty cycle and a switching frequency of the switching circuit to achieve the target pulsed output duty cycle and the target pulsed output frequency at the output of the switching circuit.

* * * * *